United States Patent
Kawanoue et al.

(10) Patent No.: US 6,518,177 B1
(45) Date of Patent: Feb. 11, 2003

(54) METHOD OF MANUFACTURING A SEMICONDUCTOR DEVICE

(75) Inventors: Takashi Kawanoue, Yokohama (JP); Junichi Wada, Yokohama (JP); Tetsuo Matsuda, Tano-gun (JP); Hisashi Kaneko, Fujisawa (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/783,561

(22) Filed: Feb. 15, 2001

Related U.S. Application Data

(62) Division of application No. 09/362,683, filed on Jul. 29, 1999, now Pat. No. 6,229,911.

(30) Foreign Application Priority Data

Jul. 30, 1998 (JP) .......................................... 10-215988

(51) Int. Cl.$^7$ ........................ H01L 21/4763; H01L 21/44
(52) U.S. Cl. ...................... 438/653; 438/627; 438/635; 438/638; 438/643; 438/685; 438/687
(58) Field of Search ................................. 438/643, 627, 438/638, 635, 648, 653, 685, 687

(56) References Cited

U.S. PATENT DOCUMENTS

| | | | |
|---|---|---|---|
| 4,829,363 A | 5/1989 | Thomas et al. ............. | 257/751 |
| 5,627,102 A | 5/1997 | Shinkari et al. ............ | 438/648 |
| 5,942,799 A * | 8/1999 | Danek et al. ................ | 257/751 |
| 6,090,702 A | 7/2000 | Okamoto ..................... | 438/637 |
| 6,130,156 A * | 10/2000 | Havemann et al. ......... | 438/637 |
| 6,153,519 A | 11/2000 | Jain et al. ................... | 438/681 |

FOREIGN PATENT DOCUMENTS

| | | |
|---|---|---|
| JP | 6-20996 | 1/1994 |
| JP | 06-333927 | 12/1994 |
| JP | 09-115917 | 5/1997 |

OTHER PUBLICATIONS

Kirchner et al., "Ultra Thin Sacrificial Diffusion Barriers—Control of Diffusion Across the Cu–SiO$_2$ Interface", Mat. Res. Soc. Symp. Proc. vol. 318, pp. 319–322, (1994).

* cited by examiner

*Primary Examiner*—Ha Tran Nguyen
(74) *Attorney, Agent, or Firm*—Finnegan, Henderson, Farabow, Garrett & Dunner, L.L.P.

(57) ABSTRACT

A semiconductor device is formed by a compound film $\alpha\gamma_x$ made of at least one element $\alpha$ selected from metal elements and at least one element $\gamma$ selected from the group consisting of boron, carbon, and nitrogen on a base layer containing oxygen (O), and forming a compound film $\alpha\gamma_yO_z$ by causing the compound film $\alpha\gamma_x$ to reduce the base layer and thereby oxidizing the compound film $\alpha\gamma_x$ on an interface of the compound film $\alpha\gamma_x$ and the base layer, wherein each of x and y is a ratio of the number of atoms of the element $\gamma$ to the number of atoms of the element $\alpha$, and z is a ratio of the number of atoms of the oxygen to the number of atoms of the element $\alpha$.

7 Claims, 19 Drawing Sheets

| OXIDE THICKNESS | THICKNESS OF TaNxOy (nm) | TaN$_{0.1}$ | TaN$_{0.2}$ | TaN$_{0.5}$ | TaN$_{1.4}$ |
|---|---|---|---|---|---|
| NO OXIDE | 0 | × | × | × | △ |
| 1nm | 1.5 | × | ○ | ○ | ○ |
| 3nm | 2 | × | ○ | ○ | ○ |
| 5nm | 3 | × | ○ | ○ | ○ |
| 10nm | PEEL-OFF | PEEL-OFF | PEEL-OFF | PEEL-OFF | PEEL-OFF |
| TaNyOz COMPOSITION | | TaN$_{0.1}$O$_{2.3}$ | TaN$_{0.2}$O$_{2.1}$ | TaN$_{0.5}$O$_{1.2}$ | TaN$_{1.4}$O$_{0.01}$ |

×: MUCH SILICIDATION
△: SLIGHT SILICIDATION
○: NO SILICIDATION

| SAMPLE | BARRIER METAL | VIA RESISTANCE (Ω) | INTERCONNECT RESISTANCE (Ω) | SILICIDATION RATE (%) |
|---|---|---|---|---|
| A | $TaN_{0.87}$(16nm)/$TaN_{1.19}$(4nm) | 4.9 | 354 | 0 |
| B | $TaN_{1.19}$(4nm)/$TaN_{0.87}$(16nm) | 7.8 | 303 | 0 |
| C | $TaN_{0.87}$(8nm)/$TaN_{1.19}$(4nm)/$TaN_{0.87}$(8nm) | 4.8 | 297 | 0 |
| D | $TaN_{0.87}$(20nm) | 4.9 | 300 | 20 |
| E | $TaN_{1.19}$(20nm) | 11.0 | 360 | 0 |

- • WN$_{1.08}$/WN$_{0.91}$
- ○ WN$_{1.23}$/WN$_{0.91}$
- ■ TaC$_{0.45}$N$_{0.42}$/TaC$_{0.44}$N$_{0.63}$
- □ TaC$_{0.45}$N$_{0.42}$/TaC$_{0.43}$N$_{0.81}$
- ▲ TiB$_{0.05}$N$_{0.81}$/TiB$_{0.32}$N$_{0.78}$/TiB$_{0.05}$N$_{0.81}$
- △ TiB$_{0.05}$N$_{0.81}$/TiB$_{0.53}$N$_{0.76}$/TiB$_{0.05}$N$_{0.81}$

- ● $HfN_{1.15}/HfN_{0.75}$
- ○ $HfN_{1.26}/HfN_{0.75}$
- ■ $TaC_{0.82}/TaC_{1.13}$
- □ $TaC_{0.82}/TaC_{1.21}$
- ▲ $ZrN_{0.93}/ZrO_{0.23}N_{0.91}/ZrN_{0.93}$
- △ $ZrN_{0.93}/ZrO_{0.35}N_{0.91}/ZrN_{0.93}$

| TaNx | TaNyOz | SILICATION RATE (%) | ADHESION |
|---|---|---|---|
| Ta | TaO$_{2.5}$ | 20 | POOR |
| TaN$_{0.2}$ | TaN$_{0.2}$O$_{2.1}$ | 1 | GOOD |
| TaN$_{0.3}$ | TaN$_{0.3}$O$_{1.0}$ | 0 | GOOD |
| TaN$_{0.5}$ | TaN$_{0.5}$O$_{1.2}$ | 0 | GOOD |
| TaN$_{0.9}$ | TaN$_{0.9}$O$_{0.3}$ | 0 | GOOD |
| TaN$_{1.2}$ | TaN$_{1.2}$O$_{0.1}$ | 0 | GOOD |
| TaN$_{1.4}$ | TaN$_{1.4}$O$_{0.01}$ | 0 | GOOD |

| OXIDATION TIME | THICKNESS OF TaN$_{0.3}$O$_{0.1}$ FILM | VIA RESISTANCE |
|---|---|---|
| 0 MIN. | 0 nm | $2 \times 10^{-10}\,\Omega\,cm^{-2}$ |
| 5 MIN. | 1.5 nm | $3 \times 10^{-10}\,\Omega\,cm^{-2}$ |
| 10 MIN. | 3.0 nm | $5 \times 10^{-10}\,\Omega\,cm^{-2}$ |
| 20 MIN. | 4.0 nm | $1 \times 10^{-9}\,\Omega\,cm^{-2}$ |

| OXIDE THICKNESS | THICKNESS OF TaNxOy (nm) | $TaN_{0.1}$ | $TaN_{0.2}$ | $TaN_{0.5}$ | $TaN_{1.4}$ |
|---|---|---|---|---|---|
| NO OXIDE | 0 | × | × | × | △ |
| 2 nm | 1.5 | × | ○ | ○ | ○ |
| 4 nm | 3.0 | × | ○ | ○ | ○ |
| 6 nm | 4.5 | PEEL-OFF | PEEL-OFF | PEEL-OFF | PEEL-OFF |
| TaNyOz COMPOSITION | | $TaN_{0.1}O_{2.3}$ | $TaN_{0.2}O_{2.1}$ | $TaN_{0.5}O_{1.2}$ | $TaN_{1.4}O_{0.01}$ |

× : MUCH SILICIDATION
△ : SLIGHT SILICIDATION
○ : NO SILICIDATION

| OXIDE THICKNESS | THICKNESS OF TaNxOy (nm) | TaN$_{0.1}$ | TaN$_{0.2}$ | TaN$_{0.5}$ | TaN$_{1.4}$ |
|---|---|---|---|---|---|
| NO OXIDE | 0 | × | × | × | △ |
| 1nm | 1.5 | × | ○ | ○ | ○ |
| 3nm | 2 | × | ○ | ○ | ○ |
| 5nm | 3 | × | ○ | ○ | ○ |
| 10nm | PEEL-OFF | PEEL-OFF | PEEL-OFF | PEEL-OFF | PEEL-OFF |
| TaNyOz COMPOSITION | | TaN$_{0.1}$O$_{2.3}$ | TaN$_{0.2}$O$_{2.1}$ | TaN$_{0.5}$O$_{1.2}$ | TaN$_{1.4}$O$_{0.01}$ |

× : MUCH SILICIDATION
△ : SLIGHT SILICIDATION
○ : NO SILICIDATION

FIG. 31

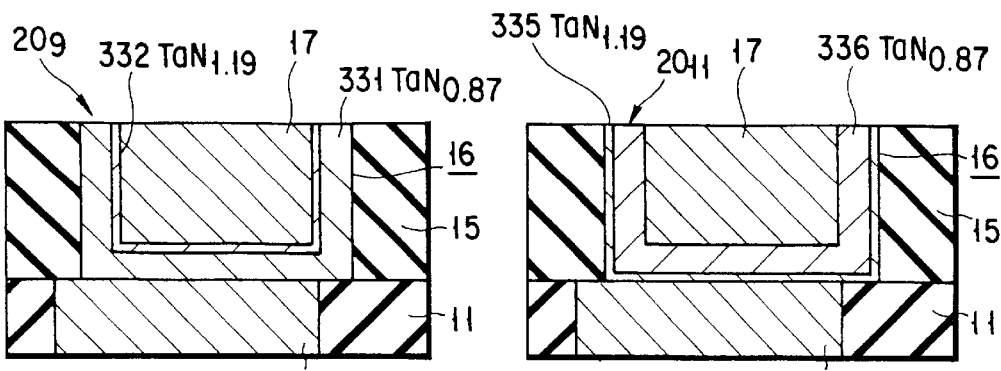
FIG. 32A  FIG. 32C
FIG. 32B  FIG. 32D
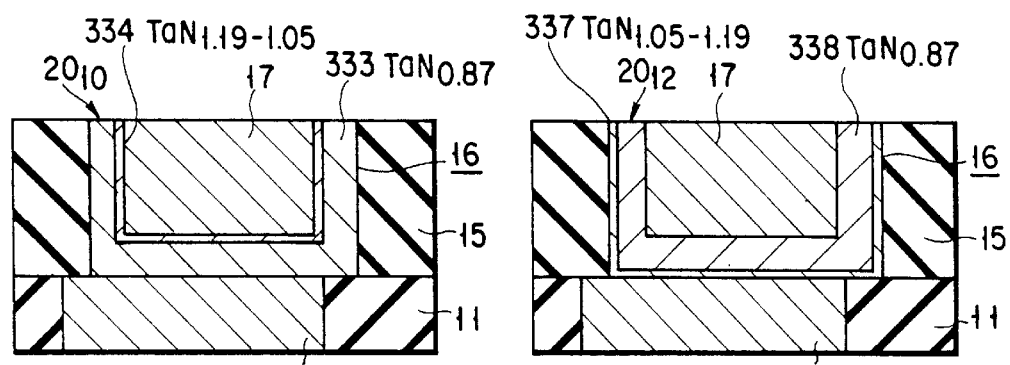
| SAMPLE | BARRIER METAL | VIA RESISTANCE (Ω) | INTERCONNECT RESISTANCE (Ω) | SILICIDATION RATE (%) |
|---|---|---|---|---|
| A | TaN0.87 (16nm) / TaN1.19 (4nm) | 4.8 | 356 | 0 |
| B | TaN0.87 (16nm) / TaN1.19-1.05 (4nm) | 4.9 | 332 | 0 |
| C | TaN1.19 (4nm) / TaN0.87 (16nm) | 7.9 | 301 | 0 |
| D | TaN1.05-1.19 (4nm) / TaN0.87 (16nm) | 5.8 | 299 | 0 |
FIG. 33

METHOD OF MANUFACTURING A SEMICONDUCTOR DEVICE

This is a division of application Ser. No. 09/362,683, filed Jul. 29, 1999, now U.S. Pat. No. 6,229,911, which is incorporated herein by reference.

BACKGROUND OF THE INVENTION

This invention relates to a semiconductor device having a barrier metal layer for suppressing diffusion of any of the elements constituting the interconnects of the device. It also relates to a method of manufacturing such a device.

Generally, a semiconductor device has a barrier metal layer arranged at the bottom or the side sides of the metal interconnects of the device. Such a barrier metal layer prevents mutual diffusion and reaction of the interconnection metal and the silicon diffusion layer, diffusion of the interconnection metal into the interlayer dielectric film surrounding the interconnection layer and reaction of the metals of the via-plug and the interconnection layer if they are made of different metals.

Barrier metal is required to show a sufficient extent of barrier effect of suppressing diffusion and reaction of the metal of the interconnection layer of semiconductor devices in the process of manufacturing the devices and during the operation of the devices due to the electric field and the high temperature existing in the devices. At the same time, it is required to be very thin in such a manner that it may not raise the effective electric resistance of the interconnects. Then, barrier metal showing a low resistivity and a low electric contact resistance has to be used in order not to raise the electric resistance at the contacts and the via-plug. Additionally, it is required to adhere well to the interlayer dielectric film and the interconnection layer.

Monolayer barrier metal of metal nitride such as TiN or TaN is known to show a satisfactory level of barrier effect in known semiconductor devices and have characteristic properties required thereto. However, with the current trend for a higher degree of integration and the use of miniature elements, a very thin barrier metal layer comes to be used in semiconductor devices at the cost of a satisfactory barrier effect.

Additionally, as copper is used popularly for the interconnection layer of semiconductor devices in recent years in an attempt for realizing high speed operation and high reliability, any known barrier metal can no longer provide a sufficient level of barrier effect of preventing copper from rapidly diffusing into the silicon substrate and the dielectric layer. Still additionally, the resistivity and the electric contact resistance of the barrier metal of a semiconductor device are required to become lower in order to make the device operate at higher speed. In short, known barrier metal can no longer provide a sufficient level of barrier effect and electric characteristics.

The insufficient barrier effect of known barrier metal is particularly remarkable in non-aluminum type metal interconnects. This is because the thin aluminum oxide film covering aluminum interconnects operates effectively as a tight barrier film. Such an aluminum oxide film layer is formed as a native oxide particularly along the interface of a metal other than aluminum and an aluminum alloy and conduction of electricity across the interface can take place in the form of tunnelling current because of the small film thickness. On the other hand, while copper, silver, gold and alloys of any of them can be used for interconnection as they show a resistivity lower than that of aluminum, they cannot be expected to form a good oxide layer as in the case of aluminum. Thus, there is a strong demand for a novel barrier metal film that provides a barrier effect better than ever.

BRIEF SUMMARY OF THE INVENTION

Therefore, it is the object of the present invention to provide a semiconductor device having a barrier metal layer that shows a high barrier effect and good electric characteristics relative to the metal of the interconnection layer of the device and also a method of manufacturing such a semiconductor device.

According to a first aspect of the invention, the above object is achieved by providing a semiconductor device comprising:

a base layer;

a barrier metal layer formed on the base layer; and a metal interconnect formed on the barrier metal layer;

the barrier metal layer being made of at least one element α selected from metal elements and at least one element β selected from a group of boron, oxygen, carbon and nitrogen and having a laminated structure formed of at least two compound films αβn with different compositional ratios in atomic level, n being a ratio of the number of atoms of the element β relative to the number of atoms of the element α.

For the purpose of the invention, the barrier metal may have a structure that shows a continuous compositional change.

Preferably, the metal element belongs to one of a IVB group, a VB group and a VIB group.

Preferably, at least one of the at least two compound films αβn is a compound film αβx (x>1) made of the element α and the element β.

Preferably, the compound film αβx (x>1) has a film thickness not greater than 10 nm.

According to a second aspect of the invention, there is provided a semiconductor device comprising:

a base layer;

a barrier metal layer formed on the base layer; and a metal interconnect formed on the barrier metal layer;

the barrier metal layer being made of at least one element α selected from metal elements and at least one element β selected from a group of boron, oxygen, carbon and nitrogen and having a laminated structure formed of at least two compound films αβn with different compositional ratios in atomic level, n being a ratio of the number of atoms of the element β relative to the number of atoms of the element a the elements α contained in the at least two compound films αβn being same and identical;

at least one of the at least two different compound films αβn being a compound film αβx (x>1) made of the element α and the element β.

For the purpose of the invention, the barrier metal may have a structure that shows a continuous compositional change.

Preferably, the barrier metal layer is formed by laying the compound film αβx (x>1) on a compound film αβy (y≦1) made of the element α and the element β and the metal interconnect is in contact with the compound film αβx (x>1).

Alternatively, the barrier metal layer may be formed by laying a compound film αβy (y≦1) made of the element α and the element β on the compound film αβx (x>1); and the metal interconnect may be held in contact with the compound film αβy (y≦1).

Still alternatively, the barrier metal layer may be formed by laying sequentially a compound film αβy (y≦1) made of the element α and the element β, the compound film αβx (x>1) and another compound film αβy (y≦1) to form a laminate.

Preferably, the x is not smaller than 1.2 and the y is not greater than 0.9.

Preferably, a total film thickness t of the compound film αβx (x>1) and a total film thickness T of the barrier metal show a relationship of t/T≦0.3.

Preferably, the metal element belongs to one of a IVB group, a VB group and a VIB group.

Preferably, a film thickness of the compound film αβx (x>1) is not greater than 10 nm.

According to a third aspect of the invention, there is provided a semiconductor device comprising:

a base layer;

a barrier metal layer formed on the base layer; and a metal interconnect formed on the barrier metal layer;

the barrier metal layer having a compound film αγx made of at least one element a selected from metal elements and at least one element γ selected from boron, carbon and nitrogen and a compound film αyyOz made of the element α, the element y and oxygen (O) arranged to form a laminate, each of x and y being a ratio of the number of atoms of the element y relative to the number of atoms of the element αγx and Z being a ratio of the number of atoms of the oxygen relative to the number of atoms of the element a.

Preferably, x is not smaller than 0.2.

Preferably, a film thickness of the compound film αyyOz is not greater than 3 nm.

Preferably, the metal element belongs to one of a IVB group, a VB group and a VIB group.

A manufacturing method of the above device preferably comprises the steps of:

forming the compound film αγx on the base layer;

forming the compound film αyyOz by oxidizing a surface of the compound film αγx; and forming the metal interconnect on the compound film αyyOz.

According to a fourth aspect of the invention, there is provided a method of manufacturing a semiconductor device comprising the steps of:

forming a compound film αγx made of at least one element a selected from metal elements and at least one element y selected from boron, carbon and nitrogen on a base layer containing oxygen (O); and forming a compound film αyyOz by causing the compound film αγx to reduce the base layer and thereby oxidizing the compound film αγx on an interface of the compound film αγx and the base layer.

Preferably, the base layer is a dielectric film layer or a metal interconnection layer.

For the purpose of the invention, a metal inter-connect includes a metal electrode such as a plug electrode.

Now, the background, the effects and the advantages of the invention will be discussed below.

Conventionally, sputtering and CVD are used as popular techniques for forming a metal compound film as barrier metal layer relative to the metal of an inter-connection layer. The most popular technique is the reactive sputtering method of causing Ar gas and gas containing an additive element to flow simultaneously, using a metal target, to form a film. With the reactive sputtering method, metal nitride films may be formed with various different compositions by modifying the flow rate of Ar gas and that of $N_2$ gas in various different ways. However, as the ratio of the number of nitrogen atoms relative to the number of atoms of the metal element (an atomic ratio of nitrogen/metal) approaches 1, the nitrogen content of the film would not increase simply by raising the flow rate of $N_2$ gas and, therefore, it has been difficult to produce a metal nitride film whose ratio of the number of nitrogen atoms relative to the number of atoms of the metal element exceeds 1.

Under these circumstances, the inventors of the present invention found that a TaN film whose ratio of the number of nitrogen atoms relative to that of Ta atoms exceeds 1 can be formed by supplying Ar gas and $N_2$ gas simultaneously into a chamber, using a Ta target, and heating the substrate temperature to about 300° C. under a condition adapted to form a TaNx film.

When the barrier effect of the obtained TaNx film relative to Cu, it was found that the barrier effect was remarkably improved when the ratio of the number of nitrogen atoms relative to that of Ta atoms exceeded 1 and still further when the ratio exceeded 1.2, as shown in FIG. 1.

This improvement of the barrier effect may be realized because the number of rapid diffusion paths such as crystal grain boundaries is reduced as the film is progressively turned amorphous by excessive nitrogen contained in the TaN film. As a result of an observation using X-ray diffractometry, the obtained TaN film was found substantially amorphous because no clear diffraction peaks of TaN were recognized when the N/Ta ratio exceeded 1.2.

However, such a TaNx (x>1) film is accompanied by a problem of a large resistivity and hence it cannot be used as barrier metal for Cu interconnects. Therefore, the inventors of the present invention continued the research effort to find that a barrier metal having a small resistivity and a high barrier effect can be obtained by laying a plurality of layers of compound film αβn made of at least one element α selected from metal elements and at least one element β selected from boron, oxygen, carbon and nitrogen to form a laminate.

Particularly, a barrier metal according to the invention can be made to reduce its via resistance and interconnect resistance without sacrificing its high barrier effect when a compound film αβx (x>1) made of at least one element α selected from metal elements and at least one element β selected from boron, oxygen, carbon and nitrogen and a compound film αβy (y≦1) made of the elements α and β are combined. Further, a laminated film can be made by changing the mixing ratio of β in the barrier metal formation process. It provides a easy process to form a laminated film in a short process time.

Additionally, a barrier metal according to the invention can be made to show a low via resistance, a low interconnect resistance and a high barrier effect when it is realized by laying a compound film αβy (y≧1) made of the elements α and β, a compound film αβx (x>1) also made of the elements α and β and another compound film αβy (y≦1) to form a laminate.

As a result of another research apart from the one described above, the inventors of the present invention also found that a barrier metal showing a low resistance and a high barrier effect can be obtained by laying a compound film αγx made of at least one element α selected from metal elements and at least one element γ selected from boron, carbon and nitrogen and a compound film αyyOz made of the elements α and y and oxygen (O) to form a laminate.

A compound film αyyOz can be produced by oxidizing the exposed surface of a compound film αγx. Alternatively, a compound film αγyOz can be produced by forming a compound film αγx on a base member typically made of $SiO_2$ and hence containing oxygen or on metal interconnects, subsequently reducing the base member or the metal interconnects by means of the compound film αγx and thereby oxidizing the compound film αγx.

As described above, according to the invention, a barrier metal showing a low resistance and a high barrier effect by laying a plurality of compound films αβn, each being made of at least one element α selected from metal elements and at least one element β selected from boron, oxygen, carbon and nitrogen.

Particularly, a barrier metal according to the invention can be made to reduce its via resistance and interconnect resistance without sacrificing its high barrier effect when it is formed by combining a compound film αβx (x>1) made of at least one element α selected from metal elements and at least one element β selected from boron, oxygen, carbon and nitrogen and a compound film αβx (x≦1) also made of the elements α and β. Such a barrier metal can be produced with a short process time because a film laminate can be prepared by modifying the mixture ratio of α and β.

According to the invention, a barrier metal showing a low resistance and a high barrier effect can also be formed by laying a compound film αγx made of at least one element α selected from metal elements and at least one element γ selected from boron, carbon and nitrogen and a compound film αγyOz made of the elements α and γ and oxygen (O).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 31 is a chart showing the results of silicidation of the seventh embodiment obtained under various different conditions.

FIGS. 32A through 32D are schematic cross sectional views of the interconnection section of the barrier metal of a semiconductor device according to an eighth embodiment of the invention, showing various different interconnection arrangements.

FIG. 33 is a chart of the results obtained in an experiment conducted to see the performance of the barrier metals of the eighth embodiment.

DETAILED DESCRIPTION OF THE INVENTION

Now, the present invention will be described in greater detail by referring to the accompanying drawings that illustrate preferred embodiments of the invention.

1st Embodiment

Figure 1:
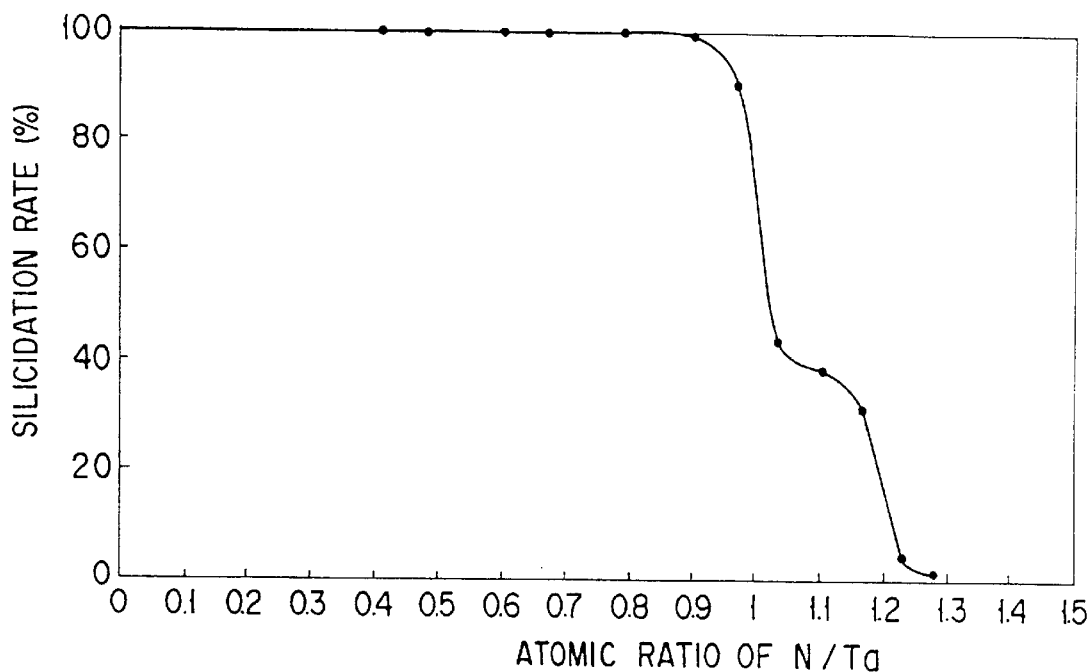
FIG. 1 is a graph showing the x-dependency of the barrier effect of a TaN film according to the invention. The silicidation in FIG. 1 is the silicided area fraction observed by the amorphous silicon test structure through this specification. 100% means that the whole area was silicided by the poor barrier effect.
Figure 2:
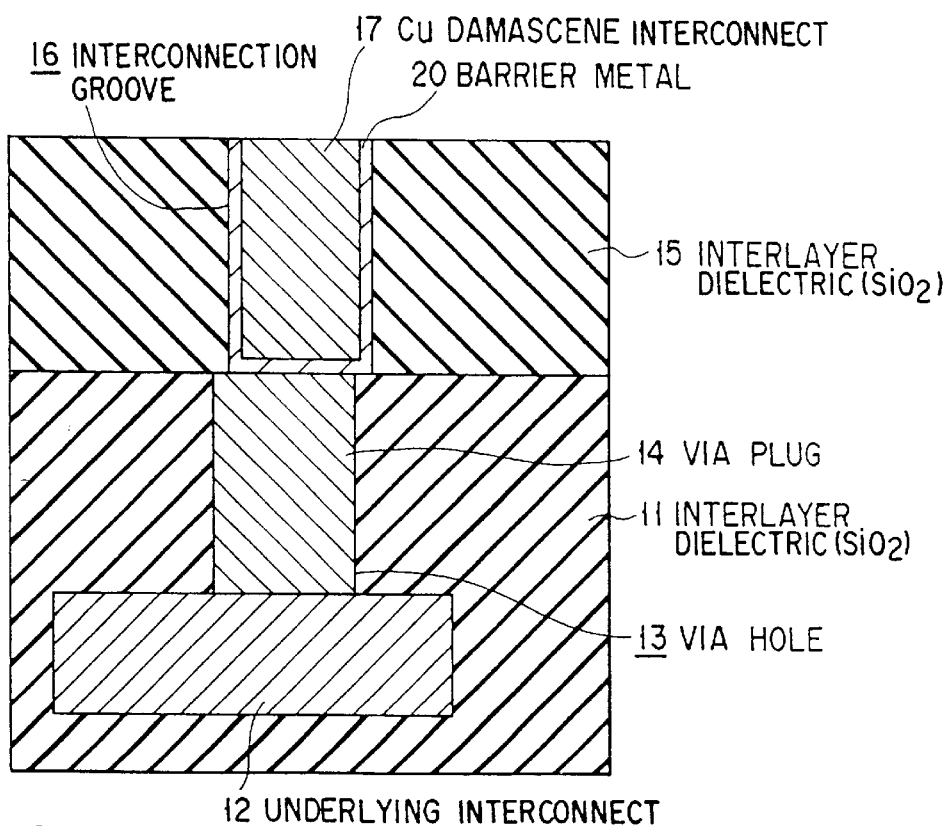
FIG. 2 is a schematic cross sectional view of a semiconductor device according to a first embodiment of the invention showing the interconnection structure of the device.

FIG. 2 is a schematic cross sectional view of a semiconductor device according to a first embodiment of the invention showing the interconnection structure of the device. Referring to FIG. 2, an underlying interconnection layer 12 is formed in a first interlayer dielectric film 11 made of $SiO_2$. A via-hole 13 is formed in the first interlayer dielectric film 11 to expose the underlying interconnection layer 12, and a W via-plug 14 is buried in the via-hole 13. A second interlayer dielectric film 15 of $SiO_2$ is formed on the first interlayer dielectric film 11 and the W via-plug 14 to a film thickness of 400 nm. An interconnection groove 16 is formed in the second interlayer dielectric film 15 for exposing the W via-plug 14. A barrier metal film layer 20 of tantalum nitride is formed on the bottom surface of the interconnection groove 16 to a film thickness of 20 nm and also on the side walls of the interconnection groove 16 to a film thickness of about 5 nm. The configuration of the barrier metal film layer 20 will be discussed later in greater detail. A Cu damascene interconnection layer 17 is buried in the interconnection groove 16.

Now, the structure of the barrier metal film layer 20 will be discussed in detail. In an experiment, devices comprising respective barrier metal film layers $20_1$ through $20_5$ Of tantalum nitride that were compositionally differentiated as shown in FIGS. 3A through 3E were formed and tested to see their barrier effects. The composition of the tantalum nitride of each of the samples was determined by means of Rutherford back-scattering spectrometry after the film formation. Note that each of FIGS. 3A through 3E shows only a principal are a of the barrier metal film layer 20 on and around the bottom of the interconnection groove 16 and the overall configuration of the semiconductor device is not shown there.

Figures 3A, 3B:
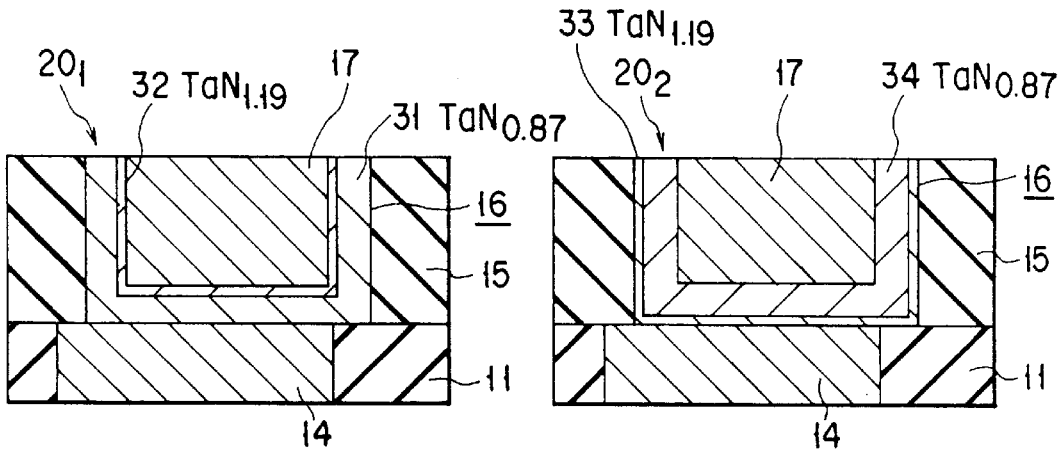
FIGS. 3A through 3E are schematic cross sectional views of the interconnection section of the barrier metal 20 used in the embodiment of FIG. 2, showing various different interconnection arrangements.

The barrier metal film layer $20_1$ of sample A shown in FIG. 3A includes a $TaN_{0.87}$ film 31 formed on the bottom surface and the side walls of the interconnection groove 16 to a film thickness of 16 nm and a $TaN_{1.19}$ film 32 formed on the $TaN_{0.87}$ film 31 to a film thickness of 4 nm and held in contact with the Cu interconnection layer 17.

The barrier metal film layer $20_2$ of sample B shown in FIG. 3B includes a $TaN_{1.19}$ film 33 formed on the bottom surface and the side walls of the interconnection groove 16 and a $TaN_{0.87}$ film 34 formed on the $TaN_{1.19}$ film 33 and held in contact with the Cu interconnection layer 17.

Figures 3C, 3D:
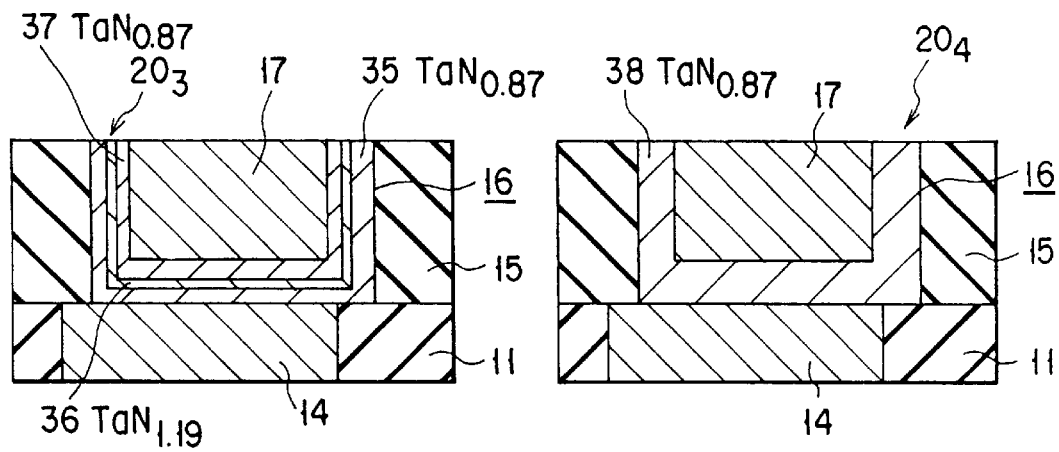

The barrier metal film layer $20_3$ of sample C shown in FIG. 3C includes a $TaN_{0.87}$ film 35 formed on the bottom surface and the side walls of the interconnection groove 16, a $TaN_{1.19}$ film 36 formed on the $TaN_{0.87}$ film 35 and another $TaN_{0.87}$ film 37 formed on the $TaN_{1.18}$ film 36 and held in contact with the Cu interconnection layer 17.

The barrier metal film layer $20_4$ of sample D shown in FIG. 3D includes only a single $TaN_{0.87}$ film 38 formed on the bottom surface and the side walls of the interconnection groove 16 and held in contact with the Cu interconnection layer 17.

Figure 3E:
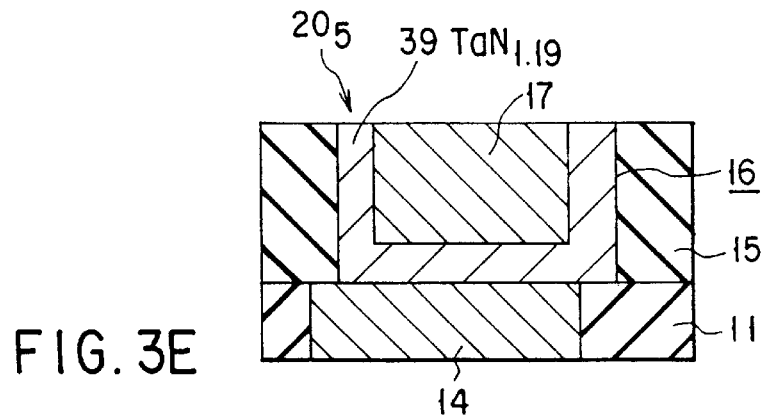

The barrier metal film layer $20_5$ of sample E shown in FIG. 3E includes only a single $TaN_{1.19}$ film 39 formed on the bottom surface and the side walls of the interconnection groove 16 and held in contact with the Cu interconnection layer 17.

Figure 4A:
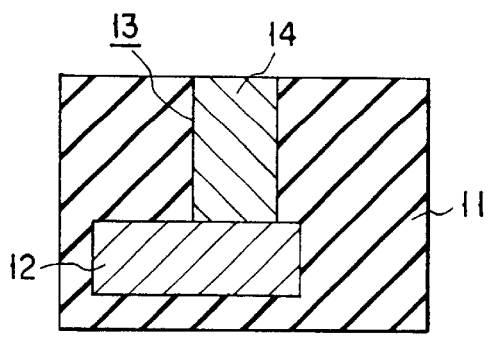
FIGS. 4A through 4D are schematic cross sectional views of the semiconductor device of FIG. 2 in different manufacturing steps.

Now, a method of manufacturing a semiconductor device as shown in FIG. 2 will be described below by referring to FIGS. 4A through 4D. Firstly, a via-hole 13 is formed in a first interlayer dielectric film 11 containing an underlying interconnection layer 12 therein and formed by plasma CVD and electrically connected to the underlying interconnection layer 12 as shown in FIG. 4A. Then, a W via-plug 14 is buried in the via-hole. 13. Such a W via-plug 14 can be formed by depositing a W film on the entire surface of the inside of the via-plug 13 to bury the latter and removing the W film on the first interlayer dielectric film 11 by means of a CMP (chemical mechanical polishing) method or an etch back method.

Figure 4B:
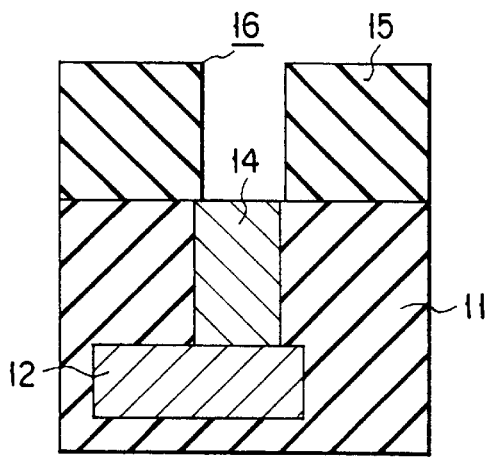

Then, as shown in FIG. 4B, a second interlayer dielectric film 15 of $SiO_2$ is formed on the entire surface of the device to a film thickness of 400 nm by plasma CVD (chemical vapor deposition). Thereafter, a resist pattern is formed on the second interlayer dielectric film 15 by means of a photolithography technique and subsequently an interconnection groove 16 is formed by etching the second interlayer dielectric film 15 by means of an RIE (reactive ion etching) technique. Then, the resist pattern is removed by means of oxygen ashing.

Figure 4C:
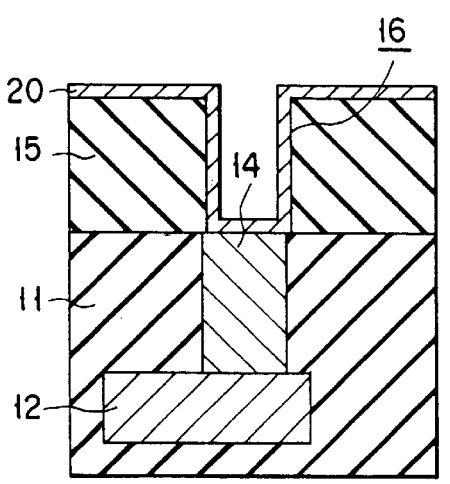

Thereafter, as shown in FIG. 4C, the W oxide on the surface of the exposed W via-plug 14 is removed by means of an organic alkaline solution and subsequently a barrier metal film layer 20 of tantalum nitride is formed on the bottom surface and the side walls of the interconnection groove 16 and the surface of the second interlayer dielectric film 15 by means of a long-throw-sputtering method. More specifically, a tantalum nitride film is formed on the entire surface of the device by feeding both Ar gas and $N_2$ gas into a reaction vessel simultaneously and sputtering a Ta target, heating the substrate to about 300° C. The method used to form the barrier metal film layer 20 of each of the samples will be discussed hereinafter.

Figure 4D:
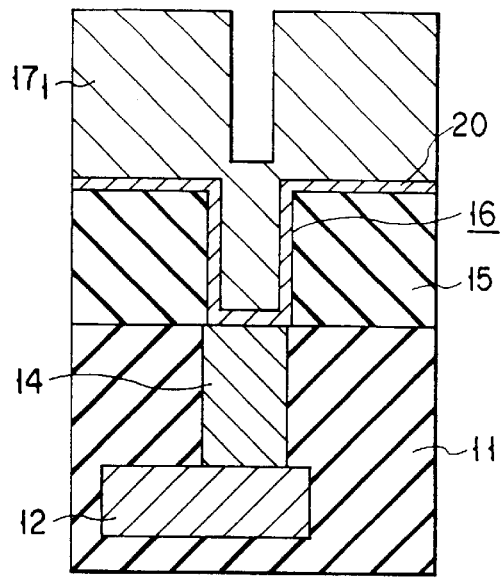

Then, as shown in FIG. 4D, a Cu film $17_1$ is formed on the barrier metal film layer 20 on the second interlayer dielectric film 15 to a film thickness of 800 nm by means of a long-throw-sputtering method and subsequently the Cu film $17_1$ is buried in the interconnection groove 16 by annealing the Cu film at 450° C. to make it reflow. Then, any excessive Cu and barrier metal are removed by means of a CMP technique to produce a device having a Cu damascene interconnection layer 17 surrounded by a barrier metal layer on the bottom surface and the side walls thereof as shown in FIG. 2.

Now, the method of forming each of the $TaN_{0.87}$ films 31, 34, 35, 37, 38 and the $TaN_{1.19}$ films 32, 33, 36, 39 in the barrier metal film layers $20_1$ through $20_5$ will be discussed below. Each of the $TaN_{0.87}$ films 31, 34, 35, 37, 38 is formed by means of a long-throw-sputtering method using a Ta target, selecting 10 sccm and 15 sccm respectively for the Ar gas flow rate and the $N_2$ gas flow rate and heating the substrate to about 300° C.

As for the laminate structure of each of the samples A through C, the laminate of a $TaN_{0.87}$ film 31 or 34, or $TaN_{0.87}$ films 35 and 37 and $TaN_{1.19}$ film 32, 33 or 36, whichever appropriate, is formed continuously by modifying the $N_2$ gas flow rate without changing the Ar gas flow rate.

Figure 5:
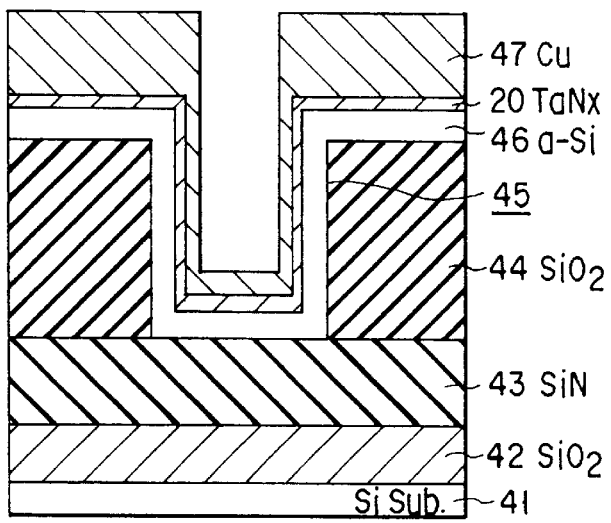
FIG. 5 is a cross sectional view of a semiconductor device according to the first embodiment of the invention, which is used to prove the barrier effect of the barrier metal used therein.

Now, the results obtained in the experiment for testing the performance of each of the prepared samples A through E will be described below. The interconnect resistance of the Cu interconnects 17 was observed by a four-terminal method and the electric resistance of the vias was observed by a Kelvin method. A sample having a multilayer structure and comprising an amorphous silicon film layer 46, a barrier metal film layer 20 and a Cu interconnection layer 47 that were sequentially laid as shown in FIG. 5 was annealed at 450° C. for 1 hour and the barrier effect of the barrier metal film layer 20 was evaluated by the silicidation rate of the Cu silicide produced as a result of diffusion of Cu from the Cu interconnection layer 47 into the amorphous silicon film layer 46.

Now, the structure of FIG. 5 will be described in greater detail. A silicon nitride film 43 is formed by plasma CVD to a film thickness of 200 nm on a 100 nm thick thermal oxide film 42 formed on a silicon substrate 41. A 400 nm thick $SiO_2$ film 44 is formed on the silicon nitride film 43 by plasma CVD. A groove 45 formed in the $SiO_2$ film 44 by photolithography and RIE is open at the top. Then, amorphous silicon film layer 46 is formed on the surface of the groove 45 by thermal CVD to a film thickness of 75 nm. Such a structure was prepared for each of the barrier metals having respective compositions same as those of the above samples A through E and a barrier metal film layer 20 was formed on the amorphous silicon film layer 46. Then, a Cu film 47 is formed on the barrier metal film layer 20.

Figures 6, 7:
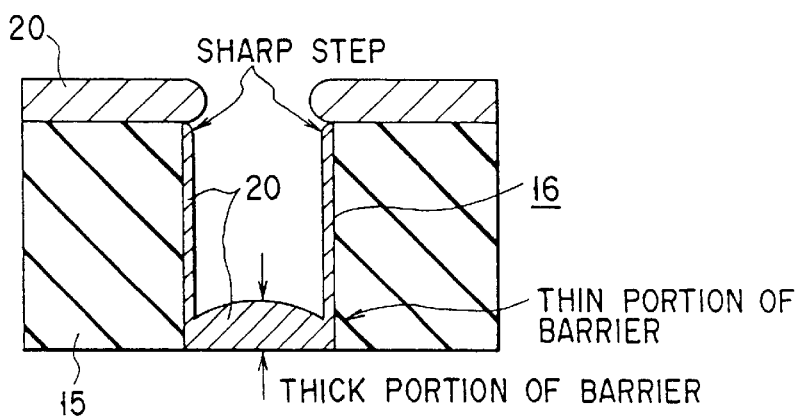
FIG. 6 is a chart of the results obtained in an experiment conducted to see the performance of the barrier metals of the first embodiment.
FIG. 7 is a schematic cross sectional view of a barrier metal film layer obtained by means of a known long-throw-sputtering method.

FIG. 6 summarily shows the results obtained by observing the interconnect resistance, the via resistance and the silicidation rate of each of the samples.

As seen from FIG. 6, the sample D showed a high silicidation rate and a low barrier effect. The sample D had a barrier metal film layer $20_4$ of a single $TaN_{0.87}$ film layer 38, showing a small value for the ratio of the number of N atoms relative to that of Ta atoms.

To the contrary, the sample E showed a high barrier effect but its via resistance and interconnect resistance were both high. The sample E had a barrier metal film layer $20_5$ of a single $TaN_{1.19}$ film layer 39, showing a large value for the ratio of the number of N atoms relative to that of Ta atoms.

On the other hand, the sample A showed a via resistance suppressed to a low level, while maintaining a high barrier effect. The sample A had a two-layered barrier metal film layer $20_1$ of a $TaN_{0.87}$ film layer 31 formed on the bottom surface and the side walls of the interconnection groove 16 and held in contact with the W via-plug 14 and a $TaN_{1.19}$ film layer 32 formed thereon and held in contact with the Cu interconnection layer 17. It may be safe to assume that the excellent performance of the sample A was obtained by that any increase in the electric contact resistance, due to nitriding of the W via-plug 14 along the surface thereof during the operation of depositing the $TaN_{1.19}$ film 32, was prevented from taking place.

The sample B could suppress the interconnect resistance to a low level, while maintaining a high barrier effect. The sample B had a two-layered barrier metal film layer $20_2$ of a $TaN_{1.19}$ film layer 33 formed on the bottom surface and the side walls of the interconnection groove 16 and held in contact with the W via-plug 14 and a $TaN_{0.87}$ film layer 34 formed thereon and held in contact with the Cu interconnection layer 17. It may be safe to assume that the excellent performance of the sample B was obtained by that the Cu was sufficiently made to reflow so as to consequently improve the phenomenon of leaving a void in the Cu interconnection layer.

The sample C could suppress both the via resistance and the interconnect resistance to a low level, while maintaining a high barrier effect. The sample C had a three-layered barrier metal film layer $20_3$ of a $TaN_{0.87}$ film layer 35 formed on the bottom surface and the side walls of the interconnection groove 16 and held in contact with the W via-plug 14, a $TaN_{1.19}$ film layer 36 formed on the $TaN_{0.87}$ film layer 35 and a $TaN_{0.87}$ film layer 37 formed on the $TaN_{1.19}$ film layer 36 and held in contact with the Cu interconnection layer 17.

As described above, a barrier metal film layer showing a low resistance and a high barrier effect can be obtained by sequentially laying a $TaN_{0.87}$ film layer and a $TaN_{1.17}$ film layer one on the other. A low via resistance, a low interconnect resistance and a high barrier effect can be achieved by using a three-layered barrier film layer of a $TaN_{0.87}$ film layer, a $TaN_{1.19}$ film layer and a $TaN_{0.87}$ film layer.

Note that the above effects can be achieved without using the above compositions so long as the barrier metal film layer has a multilayer structure comprising a plurality of $TaN_x$ (x>1) film layers and $TaN_y$ (y≦1) film layers arranged alternately. Also note that the top layer and the bottom layer may not necessarily show a same composition when the barrier metal film layer has a three-layered structure.

As described above, the $N_2$ gas flow rate is modified continuously to produce a multilayer barrier metal film layer by means of a long-throw-sputtering method for this embodiment. However, when an ordinary long-throw-sputtering method is used, the barrier metal film layer may show a small film thickness near the bottom of the side walls and a large film thickness at the center of the bottom of the interconnection groove 16 as shown in FIG. 7. Then, the film thickness of the barrier metal film layer 20 may not be optimized to consequently produce a problem of a high interconnect resistance.

Figure 8A:
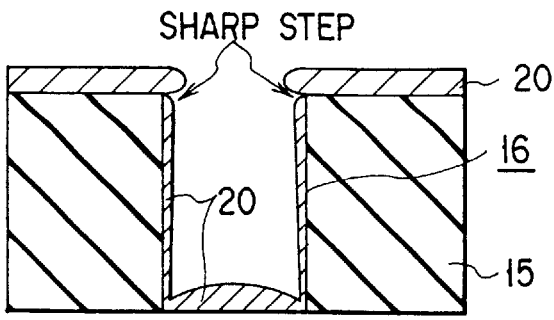
FIGS. 8A through 8C are schematic cross sectional views of a barrier metal film layer obtained by means of a known long-throw-sputtering method and a Cu film formed by making it reflow thereon, showing different stages of film formation when the Cu film is made to reflow on the barrier metal film layer.
Figure 8B:
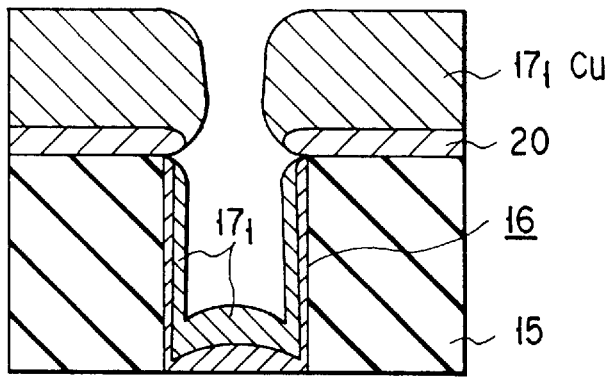
Figure 8C:
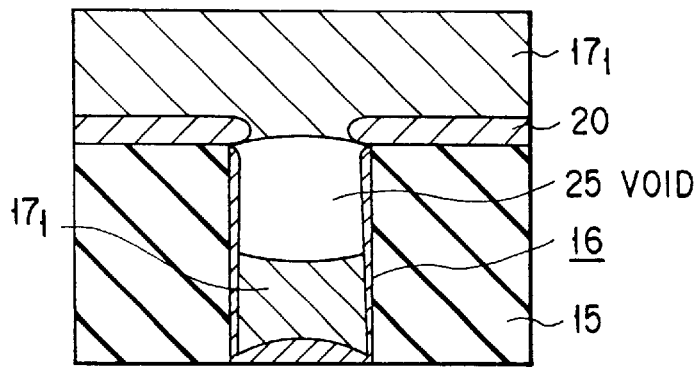

Additionally, when an ordinary long-throw-sputtering method is used for depositing barrier metal in the interconnection groove, barrier metal 20 may be made to grow in different directions on the side walls of the interconnection groove 16 and on the upper surface of the interlayer dielectric film 15 as shown in FIG. 8A so that a step can be formed with an acute angle on the barrier metal film layer 20 along the edge of the opening of the interconnection groove 16. If a Cu film layer is formed by means of a long-throw-sputtering method on the barrier metal showing such a profile, there can be areas where a Cu film layer $17_1$ is not formed as shown in FIG. 8B. Then, if the Cu film $17_1$ is made to reflow under such a condition, the flow path of the Cu film $17_1$ will be interrupted to block the Cu film $17_1$ trying to flow into the interconnection groove 16 so that a void 25 can be formed in the interconnection groove 16.

Therefore, it is desirable to employ a long-throw-sputtering method while applying a bias voltage to the substrate in order to suppress generation of a void in the subsequent Cu reflow step and effectively improve the barrier effect of the barrier metal film layer while reducing the resistance of the interconnects by optimizing the film thickness of the barrier metal film layer on the side walls and the bottom surface of the interconnection groove.

With a long-throw-sputtering method that is used in combination with a bias voltage applied to the substrate, $Ar^+$ ions collide with the substrate to form a barrier metal film layer and, at the same time, physically etch the barrier metal layer.

Figure 9:
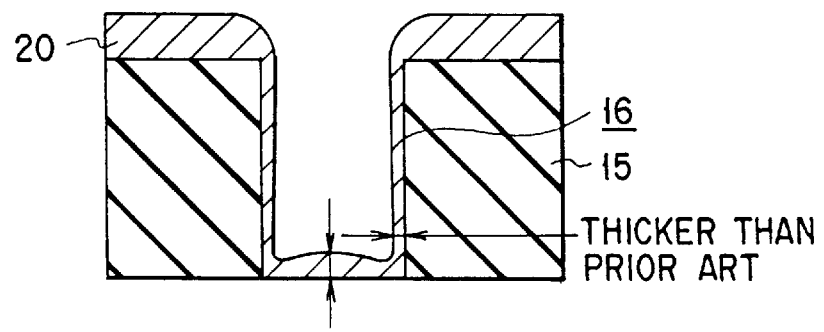
FIG. 9 is a schematic cross sectional view of a barrier metal film layer obtained by means of a long-throw-sputtering method using a bias voltage applied to a substrate.

When a barrier metal film layer is being formed while it is being etched, the overhanging section of the barrier metal film layer 20 formed along the upper edge of the interconnection groove 16 is etched so that the with of the interconnection groove 16 would not be reduced, as shown in FIG. 9. As a result, the probability of entering the interconnection groove 16 of sputtered particles is raised and the released barrier metal of the etched overhanging section resettles on the side walls of the interconnection groove 16 to increase the film thickness of the barrier metal on the side walls, where a barrier metal film layer can hardly be formed by means of an ordinary long-throw-sputtering method.

On the other hand, the barrier metal on the bottom surface of the interconnection groove 16 is also etched by $Ar^+$ ions so that the film thickness of the barrier metal would not be increased at the center of the bottom of the interconnection groove 16 and hence the interconnect resistance would not be raised either. Additionally, the barrier metal 20 etched out from the bottom surface of the interconnection groove 16 resettles on the side walls of the interconnection groove 16 at and near the bottom thereof to effectively increase the thickness of the barrier metal film layer 20 on the side walls of the interconnection groove 16 at and near the bottom thereof, where the barrier metal film layer 20 tends to be thin.

Figure 10A:
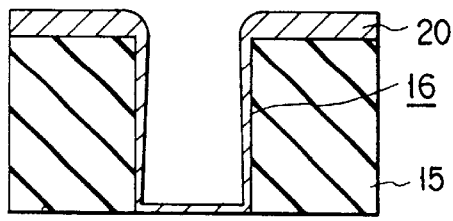
FIGS. 10A through 10C are schematic cross sectional views of a barrier metal film layer obtained by means of a long-throw-sputtering method, using a bias voltage applied to a substrate, and a Cu film formed by making it reflow thereon, showing different stages of film formation when the Cu film is made to reflow on the barrier metal film layer.
Figure 10B:
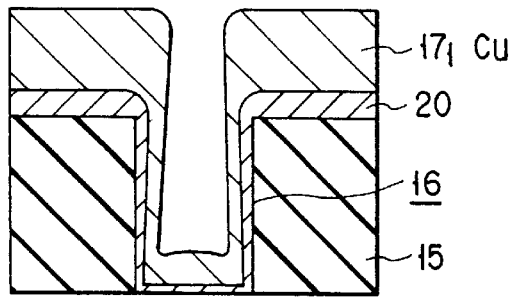
Figure 10C:
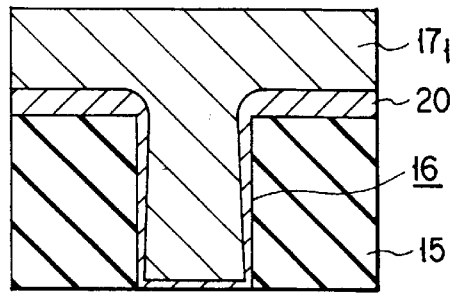

As described above, when a barrier metal film layer is formed by means of a long-throw-sputtering method in combination with a bias voltage applied to the substrate, no step would be formed with an acute angle on the barrier metal film layer 20 along the edge of the opening of the interconnection groove 16 because barrier metal is deposited to form a film layer at the opening of the interconnection groove 16 while the barrier metal existing there is etched as shown in FIG. 10A. Thus, if a Cu film $17_1$ is formed by long-throw-sputtering, no interruption would appear on the Cu film $17_1$ as shown in FIG. 10B. Therefore, the Cu film $17_1$ can easily flow into the interconnection groove 16 in a subsequent reflow step to completely fill the interconnection groove 16 as shown in FIG. 10C.

However, with a long-throw-sputtering method to be used in combination with a bias voltage applied to the substrate, $Ar^+$ ions can be taken into the barrier metal film to degrade the film quality. Therefore, a technique as will be discussed hereinafter is desirably used to eliminate the possible appearance of a step with an acute angle. Note that the following description refers to a three-layered barrier metal film comprising a $TaNy_1$ ($y_1 \leq 1$) film layer, a TaNx (x>1) film layer and a $TaNy_2$ ($Y_2 \leq 1$) film layer.

Firstly, a $TaNy_1$ ($y_1 \leq 1$) film layer is formed by long-throw-sputtering, while applying a bias voltage to the substrate, and then a TaNx (x>1) film layer is formed thereon by long-throw-sputtering without applying a bias voltage to the substrate in order to make it show a high barrier effect. Finally, a $TaNy_2$ ($y_2 \leq 1$) film layer is formed thereon also by long-throw-sputtering, while applying a bias voltage to the substrate.

When forming the $TaNy_2$ ($Y_2 \leq 1$) film layer on the TaNx (x>1) film layer, the TaNx (x>1) film layer can be resputtered in the initial stages because of the bias voltage applied to the substrate and $Ar^+$ ions can be mixed into the TaNx (x>1) film. However, the resputtering of the TaNx (x>1) film and the stray $Ar^+$ ions entering the TaNx (x>1) film layer can be suppressed by not applying a bias voltage in the initial stages of forming the $TaNy_2$ ($y_2 \leq 1$) film layer and applying a bias voltage only when the $TaNy_2$ ($Y_2 \leq 1$) film layer has been formed to a certain extent on the TaNx (x>1) film layer.

For forming the $TaNy_1$ ($y_1 \leq 1$) film layer that comes under the TaNx (x>1) film layer, the application of the bias voltage may be stopped to improve the quality of the $TaNy_1$ ($y_1 \leq 1$) film when the $TaNy_1$ ($y_1 \leq 1$) film layer shows a film thickness close to the predetermined film thickness. Then, the TaNx (x>1) film layer may be formed on a high quality $TaNy_1$ ($y_1 \leq 1$) film layer.

With this continuous film forming process, a barrier metal film layer that does not give rise to any void during the subsequent step of reflowing the Cu film can be obtained and the barrier effect of the barrier metal film layer can be ensured by the TaNx (x>1) film layer formed by long-throw-sputtering without applying a bias voltage to the substrate. Additionally, the film thickness of the side walls of the interconnection groove can be increased without increasing the film thickness of the barrier metal film on the bottom surface of the interconnection groove. Still additionally, the interconnect resistance of the device can also be reduced.

When forming a two-layered barrier metal film comprising a TaNy ($y \leq 1$) film layer and a TaNx (x>1) film layer, the latter TaNx (x>1) film will be formed by long-throw-sputtering without applying a bias voltage to the substrate to make it show a high barrier effect and the former TaNy ($y \leq 1$) film will be formed by means of a long-throw-sputtering method used in combination with application of a bias voltage to the substrate.

2nd Embodiment

This embodiment of a semiconductor device according to the invention comprises a barrier metal film layer made of metal nitride other than tantalum nitride. In an experiment, samples of this embodiment were prepared and evaluated for performance. Since the second embodiment has a configuration similar to that of the first embodiment shown in FIG. 2, only the structure of the barrier metal film layer will be illustrated particularly in terms of the interconnection groove and the illustration of the overall structure of the device is omitted. Note that the W via-plug of the first embodiment is replaced by an Al via-plug in this embodiment and the aluminum oxide on the surface of the Al via-plug is removed by sputtering/etching.

Now, the structure of the barrier metal film layer of each of the samples will be described by referring to the cross sectional views of FIGS. 11A through 11C. The first sample shown in FIG. 11A comprised a 20 nm thick two-layered barrier metal film $20_6$ of niobium nitride whose two layers were made to show different compositional ratios. The niobium nitride film was deposited by long-throw-sputtering, using a Nb target, while Ar gas and $N_2$ gas were made to flow simultaneously, heating the substrate temperature to about 300° C. Firstly, a $NbN_{0.44}$ film layer 51 was deposited to a film thickness of 16 nm as a first niobium nitride film layer with an Ar gas flow rate of 10 sccm and a $N_2$ gas flow rate of 8 sccm. Subsequently, a second niobium nitride (NbNx) film layer 52 was deposited to a film thickness of 4 nm by modifying the flow rate of $N_2$ gas while maintaining the original flow rate for Ar gas to produce a complete barrier metal film $20_6$. When depositing the NbNx film 52, the $N_2$ gas flow rate may be made to vary in order to produce various NbNx films 52 with different respective compositional ratios. An RBS measurement method was used to identify the compositional ratio of each of the various niobium nitride films.

Figure 11A:
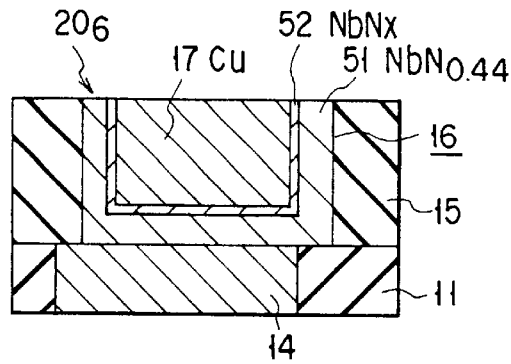
FIGS. 11A through 11C are schematic cross sectional views of the interconnection section of the barrier metal of a semiconductor device according to a second embodiment of the invention, showing various different interconnection arrangements.
Figure 11B:
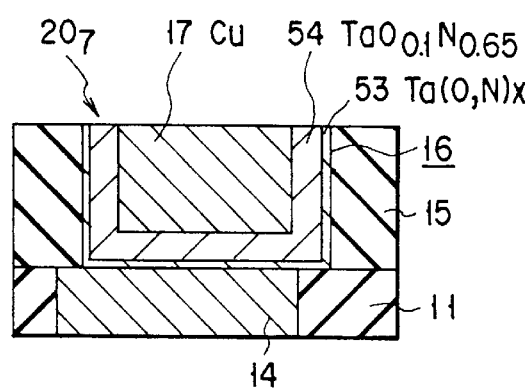

The second sample shown in FIG. 11B comprised a two-layered barrier metal film $20_7$ of tantalum nitride oxide (Ta(O, N)x) whose two layers were made to show different compositional ratios. The tantalum nitride oxide film was deposited by long-throw-sputtering, using a TaN target, while Ar gas and $N_2$ gas were made to flow simultaneously along with $O_2$ gas that was made to flow at a low rate, heating the substrate temperature to about 300° C. Firstly, a Ta(O, N)x film layer 53 was deposited to a film thickness of 2 nm as a first tantalum nitride oxide film layer. Subsequently, a second tantalum nitride oxide film layer 54 was deposited to a film thickness of 18 nm to make it show a composition of $TaO_{0.1}N_{0.65}$ by reducing the flow rate of $N_2$ gas while maintaining the original flow rate for Ar gas to produce a complete barrier metal film $20_7$. When depositing the Ta(O, N) film 54, the $N_2$ gas flow rate may be made to vary in order to produce various Ta(O, N)x films 54 with different respective compositional ratios. An RBS measurement method was used to identify the compositional ratio of each of the various niobium nitride films.

Figure 11C:
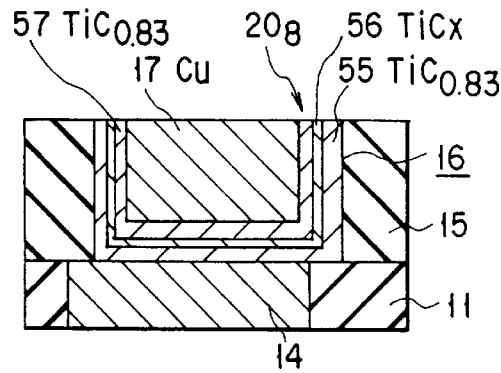

The third sample shown in FIG. 11C comprised a three-layered barrier metal film $20_8$ of titanium carbide whose three layers were made to show different compositional ratios. The titanium carbide (TiCx) film was deposited by plasma CVD, while $TiCl_4$ gas, $CH_4$ gas and $H_2$ gas were made to flow simultaneously, heating the substrate temperature to 450° C. Firstly, a 8 nm thick $TiC_{0.83}$ film layer 55 was formed as a first titanium carbide film layer and then a second titanium carbide (TiCx) film layer 56 was formed to a thickness of 4 nm by raising only the gas flow rate of $CH_4$ gas. Finally, an 8 nm thick $TiC_{0.83}$ film layer 57 was formed as a third titanium carbide film layer by restoring the original $CH_4$ gas flow rate used for forming the first titanium carbide film layer so that the three-layered barrier metal film $20_8$ was produced continuously. When depositing the TiCx film 56, the $CH_4$ gas flow rate may be made to vary in order to produce various TiCx films 56 with different respective compositional ratios. An RBS measurement method was used to identify the compositional ratio of each of the various niobium nitride films.

Figure 12:
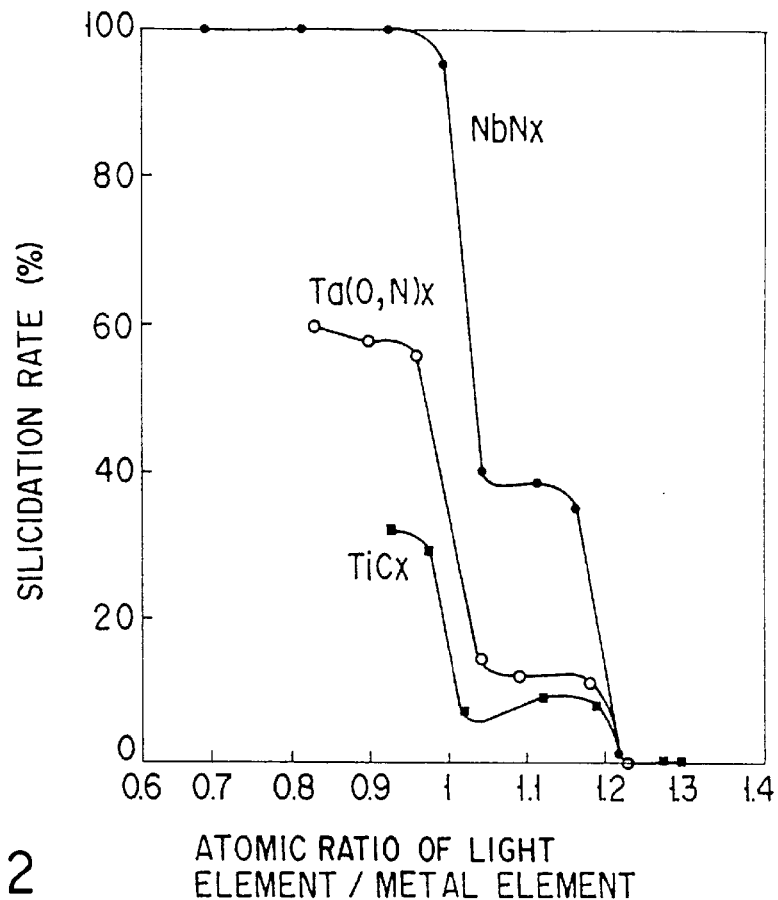
FIG. 12 is a graph showing the dependency of the silicidation rate (barrier effect) of a Cu silicide of a semiconductor device according to the invention on the concentration of a light element used therein.

Structures as shown in FIG. 5 were prepared by using the respective samples of barrier metal and the barrier effect of each of them was evaluated by observing the silicidation rate thereof. While the above samples were prepared by modifying the compositional ratio of nitrogen, nitrogen and oxygen, or carbon (light element) relative to niobium, tantalum or titanium (metal element), whichever appropriate, different samples were also prepared by modifying the compositional ratio of one or more light elements relative to a metal element and their silicidation rates were also determined. FIG. 12 is a graph summarily showing the results obtained for measuring the silicidation rate of each of the samples. In other words, FIG. 12 shows the dependency of silicidation rate on the compositional ratio of one or more light elements relative to a metal element.

The barrier effect of the barrier metal $20_6$ of the two-layered niobium nitride film shown in FIG. 11A was remarkably improved when the ratio of the number of nitrogen atoms relative to that of niobium atoms of the second NbNx film layer 52 exceeded 1.0. The barrier effect was dramatically improved when the ratio exceeded 1.2. The inventors believe that this improvement in the barrier effect was realized because the second NbNx film layer 52 was turned amorphous to a large extent by the excessive nitrogen atoms in the film layer to reduce the number of rapid diffusion paths such as crystal grain boundaries. An X-ray diffractometric observation showed no clear NbN diffraction peaks to suggest an overall metamorphosis of the compound to an amorphous state when the ratio of nitrogen atoms relative to that of niobium exceeded 1.2.

Similarly, the barrier effect of the barrier metal $20_7$ of the two-layered tantalum nitride oxide film shown in FIG. 11B was remarkably improved when the ratio of the total number of oxygen and nitrogen atoms relative to that of tantalum atoms of the first Ta(O, N)x layer exceeded 1.0 and dramatically improved when the ratio exceeded 1.2.

Likewise, the barrier effect of the barrier metal $20_8$ of the three-layered titanium carbide film shown in FIG. 11C was remarkably improved when the ratio of the total number of carbon atoms relative to that of titanium atoms of the second TiCx layer exceeded 1.0 and dramatically improved when the ratio exceeded 1.2.

To conclude, a barrier metal film showing a high barrier effect could be obtained by preparing a laminate of a NbNx, Ta(O, N)x or TiCx film, where x is greater than 1, and a NbNy, Ta(O, N)y or TiCy, whichever appropriate, where y is not greater than 1.

The barrier effect of the above samples was dramatically improved when x exceeded 1.2. In short, barrier metals showing a high barrier effect and a low electric resistance were obtained by laying a film with a value of x greater than 1.2 and a film with a value of y smaller than 0.9 for each of them.

3rd Embodiment

Figure 13:
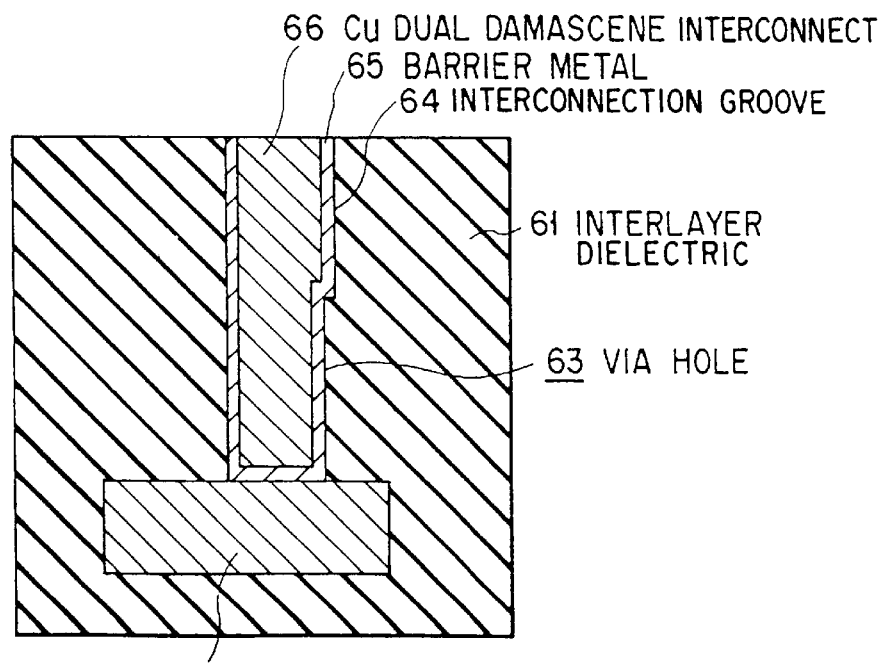
FIG. 13 is a schematic cross sectional view of a semiconductor device according to a third embodiment of the invention showing the interconnection structure of the device.

FIG. 13 is a schematic cross sectional view of a semiconductor device according to a third embodiment of the invention. Referring to FIG. 13, an underlying Cu damascene interconnection layer 62 is formed in an interlayer dielectric film 61 made of $SiO_2$. A via-hole 63 is formed in the interlayer dielectric film 61 to connect the underlying Cu damascene interconnection layer 62. An interconnection groove 64 is formed in the interlayer dielectric film 61 for exposing the Cu damascene interconnection layer 62. A barrier metal film layer 65 is formed on the bottom surface and the side walls of the via-hole 63 and also on the bottom surface (not shown in FIG. 13) and the side walls of the interconnection groove 64. The configuration of the barrier metal film layer 65 will be discussed in greater detail hereinafter. A Cu dual damascene interconnection layer 66 is buried in the via-hole 63 and the interconnection groove 64.

Now, the structure of the barrier metal film layer will be discussed in detail. In an experiment, devices comprising respectively three different barrier metal film layers as shown in FIGS. 14A through 14C were formed and tested to see their barrier effects.

Figure 14A:
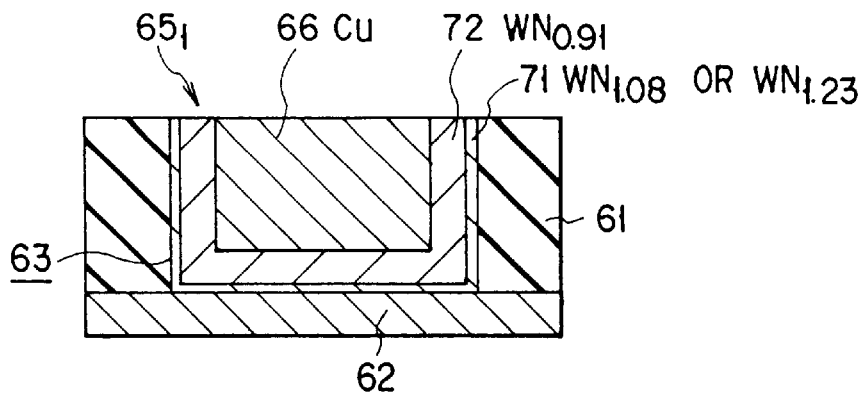
FIGS. 14A through 14C are schematic cross sectional views of the interconnection section of the barrier metal used in the embodiment of FIG. 13, showing various different interconnection arrangements.

Referring to FIG. 14A showing a first sample of a 10 nm thick barrier metal film $65_1$, it includes two tungsten nitride film layers with different respective compositional ratios. The tungsten nitride film layers were formed by MOCVD (metal organic chemical vapor deposition), using a source gas, a carrier gas of Ar and $N_2$ gas that were made to flow simultaneously, while the substrate was heated to about 450° C.

More specifically, after depositing the first tungsten nitride (WNx) film layer 71, the flow rate of $N_2$ gas was reduced to deposit the second tungsten nitride $WN_{0.91}$ film layer 72. The flow rate of $N_2$ gas was modified to produce two variations for the first tungsten nitride film, a $WN_{1.08}$ film layer and a $WN_{1.23}$ film layer. Then, the total film thickness of the WNx film layer 71 and the $WN_{0.91}$ film layer 72 was made equal to 10 nm and the ratio of the two film thicknesses were modified in various different ways to produce so many variations for the sample. An RBS measurement method was used to identify the compositional ratio of each of the various tungsten nitride films.

Figure 14B:
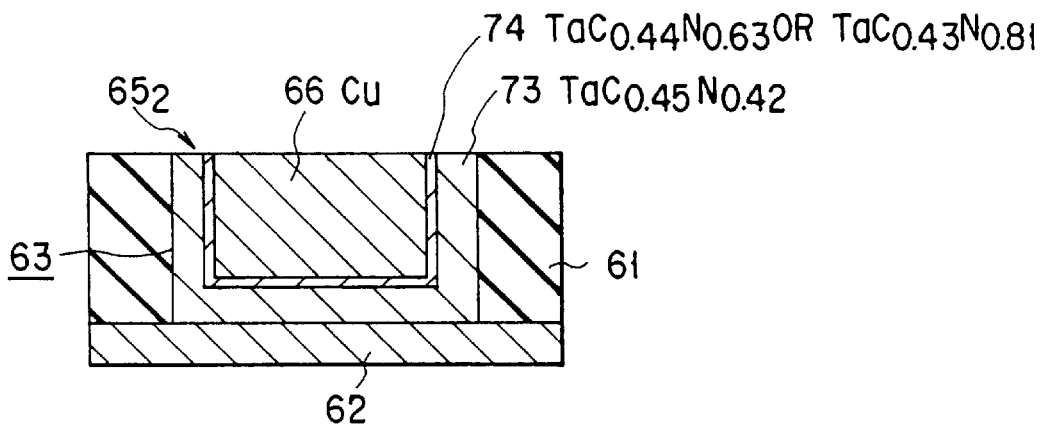
Figure 14C:
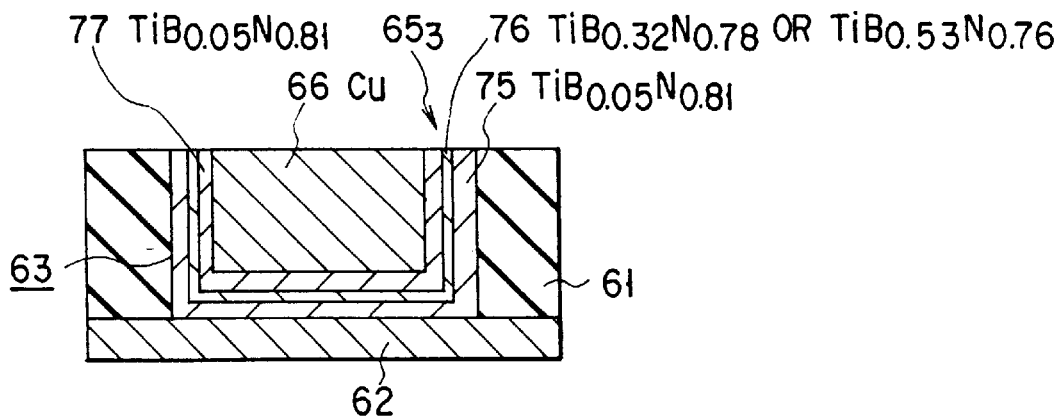

Referring to FIG. 14B showing a second sample of a 10 nm thick barrier metal film 652, it includes two tantalum carbide nitride (TaCxNy) film layers with different respective compositional ratios. The tantalum carbide nitride film layers were formed by MOCVD, using a source gas of tantalum carbide nitride, a carrier gas of Ar and $NH_3$ gas that were made to flow simultaneously, while the substrate was heated to about 450° C.

More specifically, after depositing the first tantalum carbide nitride $TaC_{0.45}N_{0.42}$ film layer 73, the flow rate of $NH_3$ gas was raised to deposit the second tantalum carbide nitride (TaCxNy) film layer 74. The flow rate of $NH_3$ gas was modified to produce two variations for the second tantalum carbide nitride film, a $TaC_{0.44}N_{0.63}$ film layer and a $TaC_{0.43}N_{0.81}$ film layer. Then, the total film thickness of the first and second tantalum carbide nitride film layers was made equal to 10 nm and the ratio of the two film thicknesses were modified in various different ways to produce so many variations for the sample. An RBS measurement method was used to identify the compositional ratio of each of the various tantalum carbide nitride films.

Referring to FIG. 14C showing a third sample of a 10 nm thick barrier metal film $65_3$, it includes three titanium boride nitride (TiBxNy) film layers with different respective compositional ratios. The titanium boride nitride film layers were formed by MOCVD, using a source gas of titanium boride nitride, a carrier gas of Ar and $B_2H_6$ gas that were made to flow simultaneously, while the substrate was heated to about 450° C.

More specifically, after depositing the first titanium boride nitride $TiB_{0.05}N_{0.81}$ film layer 75, the flow rate of $B_2H_6$ gas was raised to deposit the second titanium boride nitride film layer 76. Subsequently, the third titanium boride nitride film layer 77 of $TiB_{0.05}N_{0.81}$ deposited by restoring the original flow rate of $B_2H_6$ gas used for the first film layer to produce a three-layered barrier metal film continuously. The flow rate of $B_2H_6$ gas was modified to produce two variations for the second titanium boride nitride film, a $TiBC_{0.32}N_{0.78}$ film layer and a $TiB_{0.53}N_{0.76}$ film layer. Then, keeping the total film thickness of the first and second tantalum carbide nitride film layers equal, the ratio of the three film thicknesses were modified in various different ways to produce so many variations for the sample. An RBS measurement method was used to identify the compositional ratio of each of the various titanium boride nitride films.

Figure 15A:
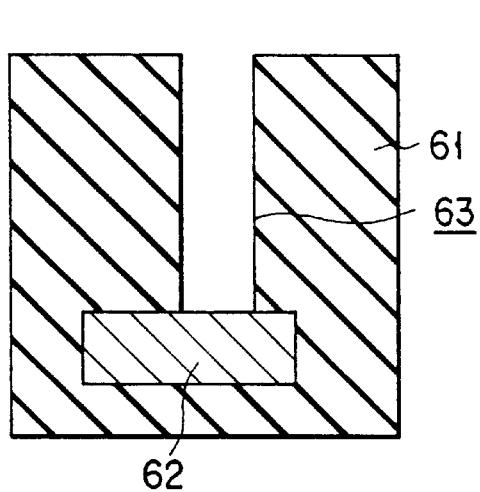
FIGS. 15A through 15D are schematic cross sectional views of the interconnection section of the embodiment of FIG. 13 in different manufacturing steps.

Now, a method of manufacturing a semiconductor device of this embodiment will be described below briefly. Firstly, a via-hole 63 is formed in a first interlayer dielectric film 61 containing an underlying Cu damascene interconnection layer 62 therein and formed by plasma CVD and electrically connected to the underlying Cu damascene interconnection layer 62 as shown in FIG. 15A.

Figure 15B:
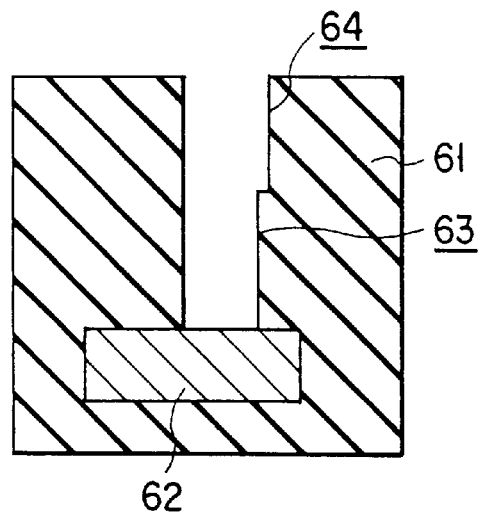

Thereafter, as shown in FIG. 15B, an interconnection groove 64 is formed in the interlayer dielectric film 61 and connected to the via-hole 63 by means of a combined use of photolithography and RIE.

Figure 15C:
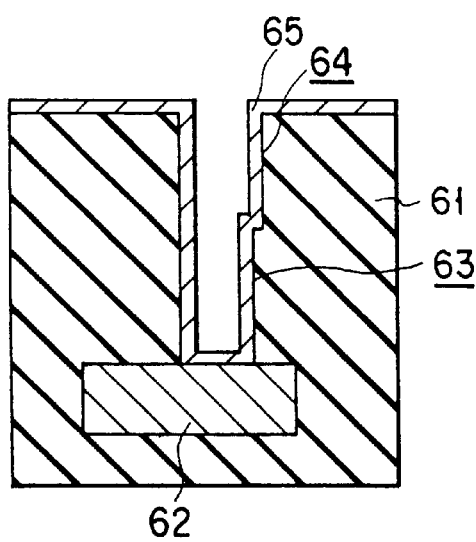

Subsequently, as shown in FIG. 15C, a barrier metal film layer 65 is formed not only on the bottom surface and the side walls of via-hole 63, but also on the bottom surface (not shown in FIG. 15C) and the side walls of the interconnection groove 64 and the surface of the interlayer dielectric film 61 by means of the above described technique.

Figure 15D:
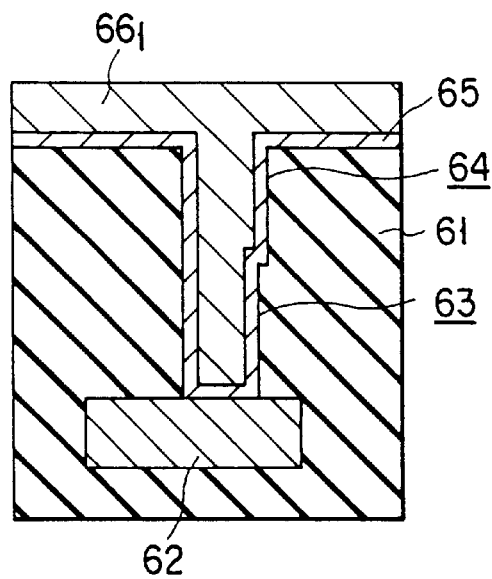

Then, as shown in FIG. 15D, a Cu film 661 is formed on the entire surface of the device to fill the via-hole 63 and the interconnection groove 64 simultaneously with the Cu film $66_1$. Then, any excessive Cu film $66_1$ and barrier metal layer 65 are removed by means of a CMP technique to produce a device having a Cu dual damascene interconnection layer 66 surrounded by a barrier metal layer 65 on the bottom surface and the side walls thereof as shown in FIG. 13.

Figure 16:
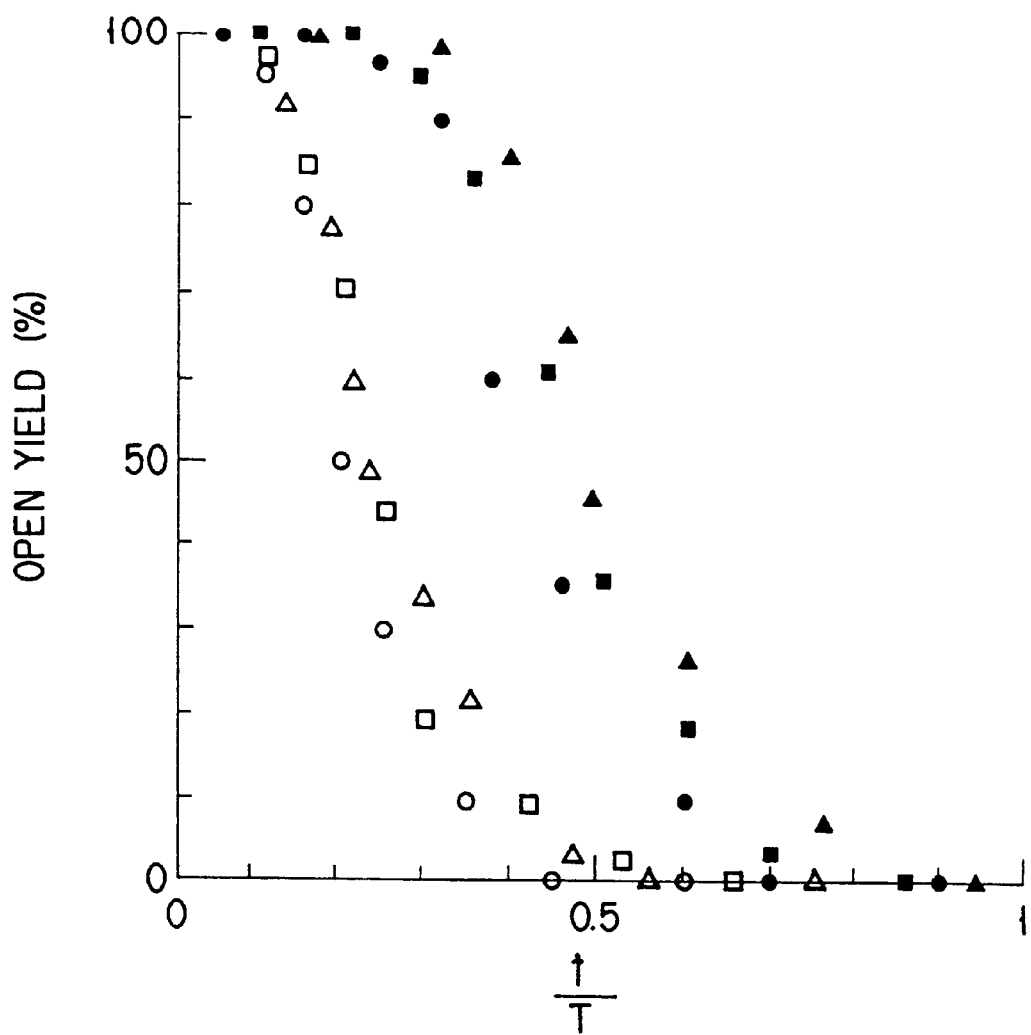
FIG. 16 is a graph showing the open yield of a Cu dual damascene interconnection arrangement formed on the barrier metal film layer of FIGS. 14A through 14C.

FIG. 16 summarily shows the results of an observation of the open yield of the Cu dual damascene interconnection layer 66 of this embodiment. In FIG. 16, the vertical axis indicates the open yield and the horizontal axis indicates the ratio of the film layer t of the compound layer showing the largest ratio of the total number of atoms of the added elements relative to that of the metal element of the laminate relative to the overall film thickness T of the barrier metal film layer. More specifically, the compound layer showing the largest ratio of the total number of atoms of the added elements relative to that of the metal element of the laminate was the first tungsten nitride ($WN_{1.08}$, $WN_{1.23}$) film layer 71 for the first sample, the second tantalum carbide nitride ($TaC_{0.44}N_{0.63}$, $TaC_{0.43}N_{0.81}$) film layer 74 for the second sample and the second titanium boride nitride ($TiB_{0.32}N_{0.78}$, $TiB_{0.53}N_{0.76}$) film layer 76 for the third sample. It was also found that a defective openness was caused by a peeled barrier metal film layer given rise to in the CMP process.

For the compound layers whose largest ratio x of the total number of atoms of the added elements relative to that of the metal element of the laminate was greater than 1.2, or $WN_{1.23}/WN_{0.91}$, $TaC_{0.45}N_{0.42}/TaC_{0.43}N_{0.81}$ and $TiB_{0.05}N_{0.81}/TiB_{0.53}N_{0.76}/TiB_{0.05}N_{0.81}$ film layers, the open yield was found to be greatly improved when the ratio t/T underwent 0.1.

For the compound layers whose largest ratio x of the total number of atoms of the added elements relative to that of the metal element of the laminate was greater than 1.0 and smaller than 1.2, or $WN_{1.08}/WN_{0.91}$, $TaC_{0.45}N_{0.42}/TaC_{0.44}N_{0.63}$ and $TiB_{0.05}N_{0.81}/TiB_{0.32}N_{0.78}/TiB_{0.05}N_{0.81}$ film layers, the open yield was found to be greatly improved when the ratio t/T underwent 0.3.

The inventors believe that the improvement in the open yield is achieved because of the dependency on the film thickness ratio of the open yield that is given rise to as there exists a critical film thickness ratio at which a metal compound film layer showing a small x value can marginally support another metal compound film that is mechanically fragile and shows a large x value.

As described above, the mechanical strength of the barrier metal film layer of a semiconductor device according to the invention can be raised to improve the open yield by selecting a value of less than 0.3 for the ratio of the film layer t of the compound layer showing the largest ratio of the total number of atoms of the added elements relative to that of the metal element of the laminate relative to the overall film thickness T of the barrier metal film layer, or a relationship of $t/T \leq 0.3$.

4th Embodiment

This embodiment of semiconductor device according to the invention comprises a barrier metal film layer made of metal nitride other than tantalum nitride. In an experiment, samples of this embodiment were prepared and evaluated for performance. Since the fourth embodiment has a configuration similar to that of the semiconductor device shown in FIG. 13, only the structure of the barrier metal film layer will be illustrated in FIGS. 17A through 17C particularly in terms of the interconnection groove and the illustration of the overall structure of the device is omitted. Note that the components in FIGS. 17A through 17C that are identical with their counterparts of FIGS. 14A through 14C are denoted respectively by the same reference symbols and will not be described any further.

Now, the structure of the barrier metal film layer of each of the samples will be described by referring to the cross sectional views of FIGS. 17A through 17C.

Figure 17A:
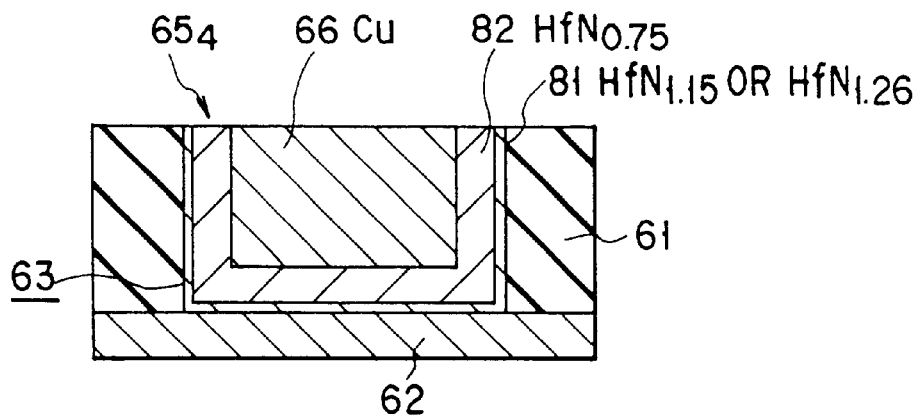
FIGS. 17A through 17C are schematic cross sectional views of the interconnection section of the barrier metal of a semiconductor device according to a fourth embodiment of the invention, showing various different interconnection arrangements.

The first sample shown in FIG. 17A comprised a two-layered barrier metal film $65_4$ of hafnium nitride whose two layers were made to show different compositional ratios. The hafnium nitride film was deposited by long-throw-sputtering, using an Hf target, while Ar gas and $N_2$ gas were made to flow simultaneously as sputtering gas, heating the substrate temperature to about 300° C.

After deposing an $HfN_{0.75}$ film layer, the formed $HfN_{0.75}$ film layer was subjected to a plasma nitriding process, allowing both $N_2$ gas and $H_2$ gas to flow simultaneously. As a result, an HfNx film layer 81 was formed as a first hafnium nitride film layer. Subsequently, another hafnium nitride film layer was formed as a second hafnium nitride $HfN_{0.75}$ film layer 82 under the same conditions to make it show a film thickness of 10 nm on the bottom of the interconnection groove. More specifically, two variations were produced for the first HfNx film layer 81 of the barrier metal film layer $65_4$, or $HfN_{1.15}$ and $HfN_{1.26}$ by modifying the plasma nitriding process. An XPS measurement method was used to identify the compositional ratio of each of the various hafnium nitride films. Variations with different film thicknesses were prepared for the first hafnium nitride film layer.

Figure 17B:
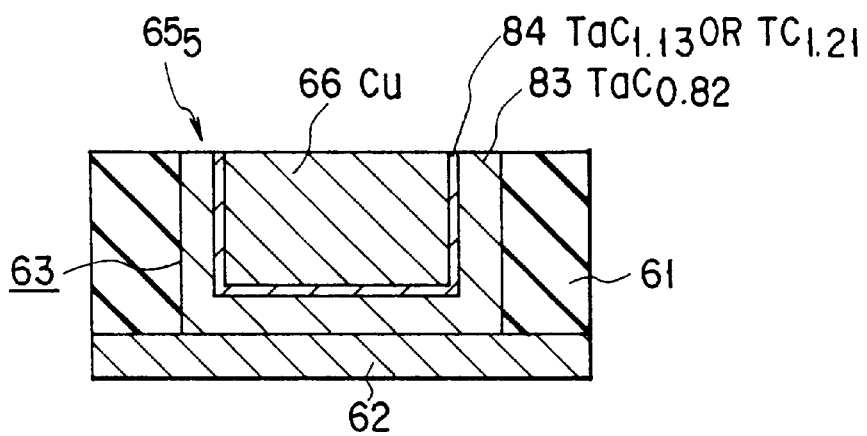

The second sample shown in FIG. 17B comprised a two-layered barrier metal film $65_5$ of tantalum carbide whose two layers were made to show different compositional ratios. The tantalum carbide film was deposited by long-throw-sputtering, using a TaC target, while Ar gas and $CH_4$ gas were made to flow simultaneously as sputtering gas, heating the substrate temperature to about 300° C.

After deposing a $TaC_{0.82}$ film layer 83, another tantalum carbide film layer 84 was deposited by raising the flow rate of $CH_4$ gas to produce a barrier metal film $65_5$ for this sample. More specifically, two variations were prepared for the second tantalum carbide film layer 84, or a $TaC_{1.13}$ film layer or a $TaC_{1.21}$ film layer, by modifying the flow rate of $CH_4$ gas in order to produce two variations of barrier metal $65_5$. An XPS measurement method was used to identify the compositional ratio of each of the various tantlum carbide films. Variations with different film thicknesses were prepared for the second tantalum carbide film layer.

Figure 17C:
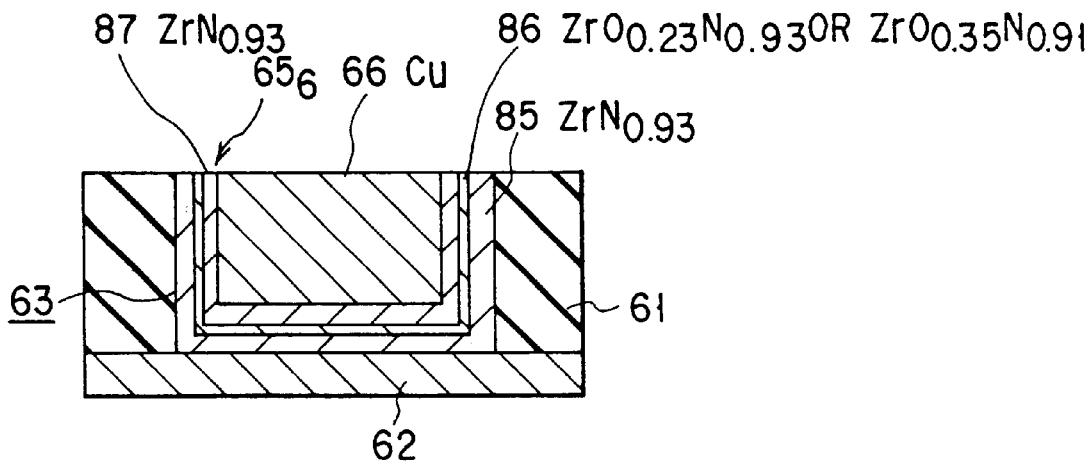

The third sample shown in FIG. 17C comprised a three-layered barrier metal film $65_6$ of zirconium nitride having two zirconium nitride film layers and a zirconium nitride oxide (ZrNyOz) film layer. The zirconium nitride film was deposited by long-throw-sputtering, using a Zr target, while Ar gas and $N_2$ gas were made to flow simultaneously as sputtering gas, heating the substrate temperature to about 300° C.

After deposing a $ZrN_{0.93}$ film layer 85 to a film thickness of greater than 5 nm, the formed $ZrN_{0.93}$ film layer 85 was subjected to an $O_2$ plasma processing operation to make the residual film of the first $ZrN_{0.93}$ film layer 85 show a film thickness of 5 nm on the bottom of the interconnection groove 64 and then a zirconium nitride oxide film layer 86 is formed as second film layer on the first $ZrN_{0.93}$ film layer 85. Thereafter, another $ZrN_{0.93}$ film layer 87 was deposited as a third film layer on the second film layer under the above conditions for forming the first film layer. More specifically, two variations were prepared for the second film layer 86 of zirconium nitride oxide, $ZrO_{0.23}N_{0.93}$ and $ZrO_{0.35}N_{0.91}$, by modifying conditions of the $O_2$ plasma processing operation in order to produce two variations of the barrier metal film $65_6$.

Figure 18:
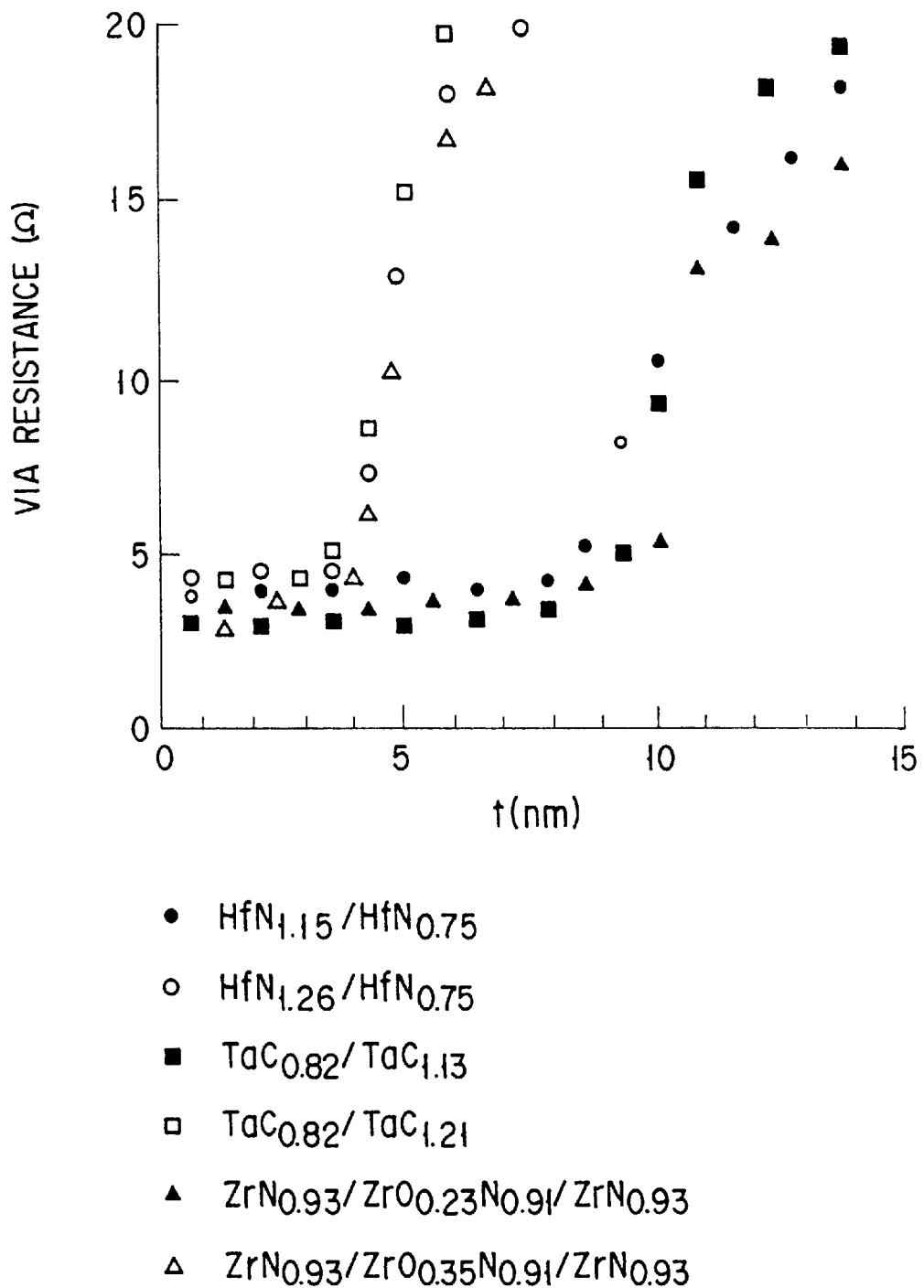
FIG. 18 is a graph showing the via resistances of the Cu damascene interconnection arrangements of the fourth embodiment of FIGS. 17A through 17C.

FIG. 18 summarily shows the results of an observation of the via resistance of the Cu damascene interconnection of this embodiment. In FIG. 18, the vertical axis indicates the via resistance and the horizontal axis indicates the ratio of the film layer t of the compound layer showing the largest ratio of the total number of atoms of the added elements relative to that of the metal element of the laminate relative to the overall film thickness T of the barrier metal film layer. More specifically, the compound layer showing the largest ratio of the total number of atoms of the added elements relative to that of the metal element of the laminate was the first hafnium nitride ($HfN_{1.15}$, $HfN_{1.26}$) film layer 81 for the first sample, the second tantalum carbide ($TaC_{1.13}$, $TaC_{1.21}$) film layer 84 for the second sample and the second zirconium nitride oxide ($ZrO_{0.23}N_{0.93}$, $ZrO_{0.35}N_{0.91}$) film layer 86 for the third sample.

For the compound layers whose largest ratio x of the total number of atoms of the added elements relative to that of the metal element of the laminate was greater than 1.2, or $HfN_{1.26}/HfN_{0.75}$, $TaC_{0.82}/TaC_{1.12}$ and $ZrN_{0.93}/ZrO_{0.35}N_{0.91}/ZrN_{0.93}$ film layers, the via resistance was found to be greatly reduced when the film thickness t underwent 5 nm.

For the compound layers whose largest ratio x of the total number of atoms of the added elements relative to that of the metal element of the laminate was greater than 1.0 and smaller than 1.2, or $HfN_{1.15}/HfN_{0.75}$, $TaC_{0.82}/TaC_{1.13}$ and $ZrN_{0.93}/ZrO_{0.23}N_{0.91}/ZrN_{0.93}$ film layers, the via resistance was found to be greatly reduced when the film thickness t underwent 10 nm.

While the reason why the via resistance was reduced is not clear, the inventors believe on the basis of the fact that an electric current flows due to the tunnelling effect when the film thickness of a dielectric film falls below several nanometers that a specific transmission mechanism comes to function to allow an electric current to flow easily when the film thickness is reduced to a certain low level.

As described above, the via resistance of a semiconductor device according to the invention can be reduced by selecting a value less than 10 nm for the film thickness of the compound layer showing the largest ratio x of the total number of atoms of the added elements relative to that of the metal element out of the compound film layers of the barrier metal.

5th Embodiment

Figure 19:
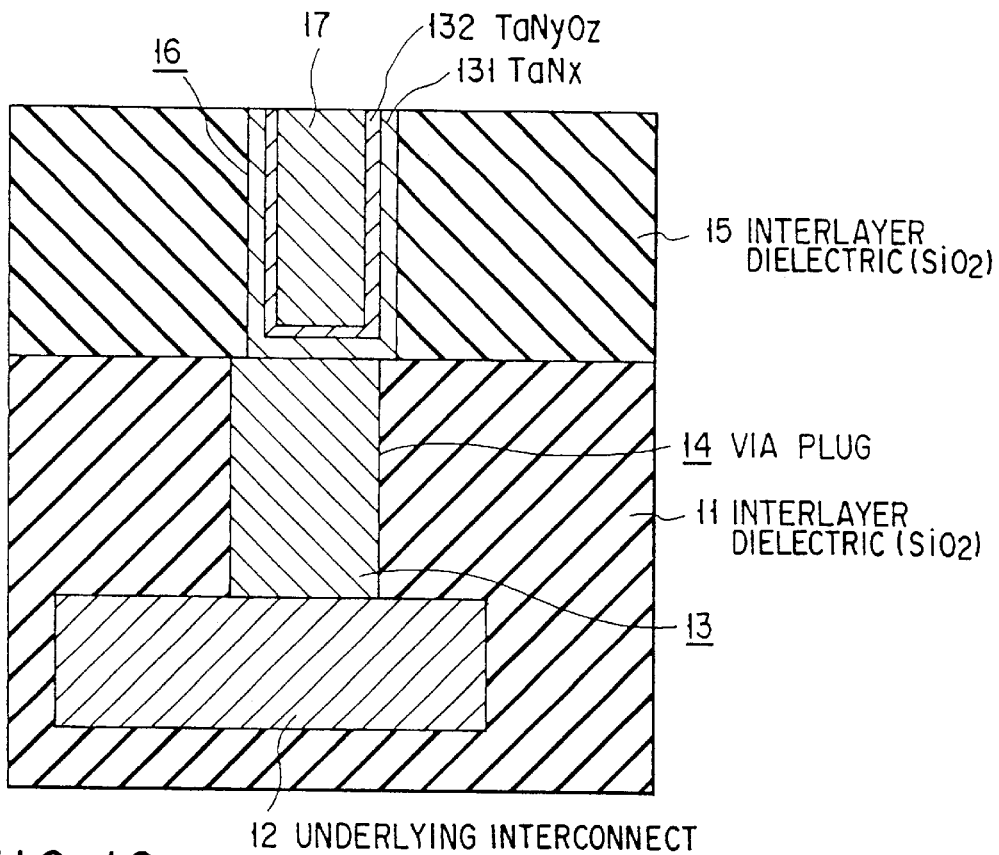
FIG. 19 is a schematic cross sectional view of the interconnection section of the barrier metal of a semiconductor device according to a fifth embodiment of the invention.

FIG. 19 is a schematic cross sectional view of a semiconductor device according to a fifth embodiment of the invention. Note that, in FIG. 19, the components that are same as their counterparts of FIG. 2 are denoted respectively by the same reference symbols and will not be described any further.

This embodiment is characterised in that a laminate film of a TaNx (x>0.2) film layer 131 formed on the side walls and the bottom surface of an interconnection groove 16 and a TaNyOz film layer 132 held in contact with a Cu damascene interconnection layer is used for the barrier metal film layer.

Now, the method of manufacturing the device will be described by referring to FIGS. 20A through 20D. Since the steps of manufacturing the device are same as those illustrated in FIGS. 4A through 4D for the embodiment of FIG. 2 except those for preparing the barrier metal film, only the steps for preparing the barrier metal film layer will be illustrated particularly in terms of a bottom region of the interconnection groove of the barrier metal film layer.

Figure 20A:
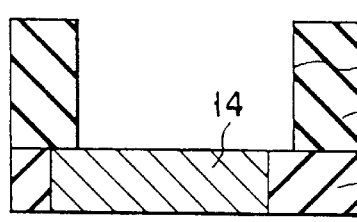
FIGS. 20A through 20D are schematic cross sectional views of the interconnection section of the embodiment of FIG. 19 in different manufacturing steps.

Firstly, as shown in FIG. 20A, an interconnection groove 16 is formed in the second interlayer dielectric film 15 to electrically connect the w via-plug 14.

Figure 20B:
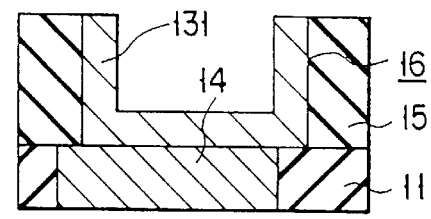
Figure 20C:
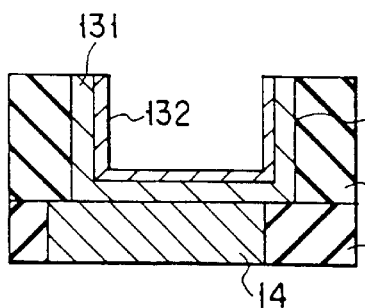
Figure 20D:
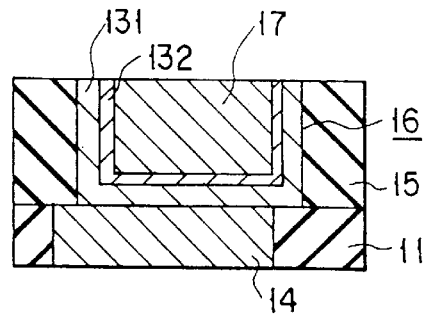

Then, as shown in FIG. 20B, a TaNx film layer 131 is formed on the entire surface of the device by means of long-throw-sputtering. Subsequently, a TaNyOz film 132 is formed on the surface of the TaNx film layer 131 by exposing the latter to air for 5 minutes. After forming a Cu film layer on the entire surface, the Cu film, the TaNx film 131 and the TaNyOz film 132 on the second interlayer dielectric layer are removed by means of CMP to produce a Cu damascene interconnection layer 17.

Figures 21, 22, 23:
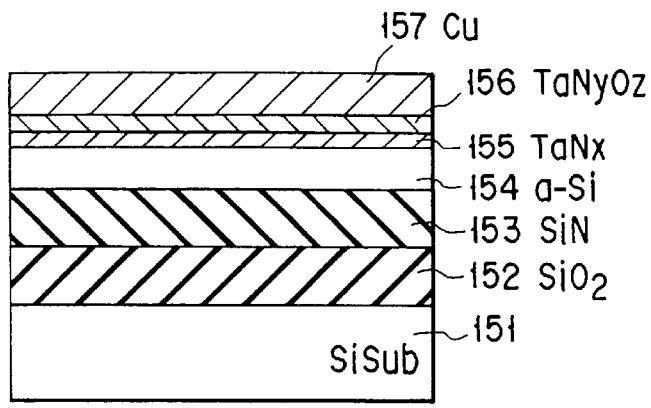
FIG. 21 is a cross sectional view of a semiconductor device according to the fifth embodiment of the invention, which is used to prove the barrier effect of the barrier metal used therein.
FIG. 22 is a chart of the results obtained in an experiment conducted to see the performance of the barrier metal of the fifth embodiment.
FIG. 23 is a graph showing the relationship between the oxidation time, and the film thickness of the barrier metal film and the via resistance of the fifth embodiment.

The barrier effect of the barrier metal of this embodiment was evaluated in an experiment in the following way. A sample prepared by sequentially laying an amorphous silicon layer 154, a TaNx film layer 155, a TaNyOz film layer 156 and a Cu film layer 157 as shown in FIG. 21 was annealed for 4 hours and the rate of generation of $Cu_3Si$ (Cu silicide) (silicidation rate) in the amorphous silicon film layer 154, into which Cu had been diffused by way of the barrier metal, was observed as index of the barrier effect of the barrier metal. Additionally, the adhesion of the Cu film to the underlying layer was observed in a tape peeling test conducted after the formation of the Cu film.

The structure of the sample of FIG. 21 will be described below in detail. A 100 nm thick thermal oxidation film 152 is formed on a silicon substrate 151 and a 100 nm thick silicon nitride film 153 is formed thereon by a low pressure CVD method. An amorphous silicon film 154 is formed on the silicon nitride film 153. Then, a TaNx film 155 is formed on the amorphous silicon film 154 and a TaNyOz film 156 is formed on the surface of the TaNx film 155. Finally, a Cu film 157 is formed on the TaNyOz film.

Note that, more specifically, after forming the TaNx film 155 by sputtering in a mixture of $N_2$ gas and Ar gas, heating the substrate to about 300° C., the TaNyOz film 156 is obtained by exposing the TaNx film 155 to the atmosphere for 5 minutes. In an experiment, variations of the TaNyOz film 156 were prepared by forming corresponding variations of the TaNx film 155 by modifying the flow rate of Ar gas and that of $N_2$ gas in various different ways and oxidizing the obtained variations of the TaNx film layer 155.

FIG. 22 summarily shows the results of an evaluation test for evaluating the silicidation rate and the adhesion. An RBS measurement method was used to identify the composition of each of the TaNx films and an XPS measurement method was used to identify the compositional ratio of each of the various oxide film layers formed on the surfaces of the respective TaNx films layers.

As seen from FIG. 22, an oxide film layer formed on the TaNx film having a composition of X=0.2 or more in favor of nitrogen can improve the barrier effect against Cu diffusion into the TaNx film and also the adhesion of the Cu film to the underlying layer. Additionally, the surface oxide film layer is less apt to be formed as the nitrogen concentration of the TaNx increases. A $TaN_{1.4}$ film provides a good barrier effect and an excellent degree of adhesion if the surface oxide film layer is substantially non-existent.

In another experiment, the via resistance of the $Cu/TaN_{0.3}O_{1.0}$ film was observed by selecting 0 minute, 5 minutes, 10 minutes and 20 minutes for the duration of exposure to the atmosphere of the $TaN_{0.3}$ film to obtain different film thicknesses for the $TaNaN_{0.3}O_{1.0}$ film layer. FIG. 23 summarily shows the obtained results. Note that the via resistance was observed by means of a Kelvin pattern.

As seen from FIG. 23, the via resistance remarkably increases when the film thickness of the TaNyOz film exceeds 3 nm.

While the surface layer of this embodiment is exposed to the atmosphere to produce a surface oxide film layer, a similar effect of producing a surface oxide film layer can be achieved by exposing the surface layer to an oxidizing atmosphere containing oxygen or steam.

As described above, a barrier metal film layer showing a low electric resistance and a high barrier effect can be obtained by forming a laminate of a TaNx film layer and a TaNyOz film layer. Preferably, the film thickness of the TaNyOz film is made less than 3 nm in order to sufficiently reduce the via resistance.

6th Embodiment

Figure 24:
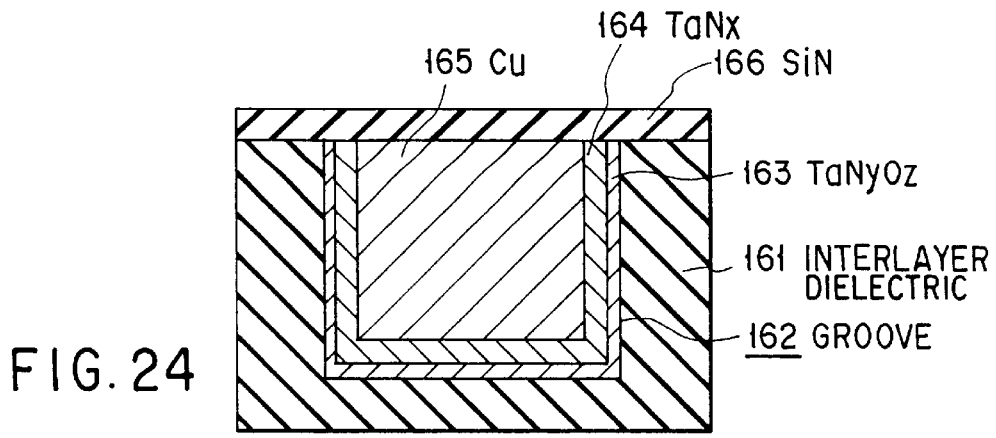
FIG. 24 is a schematic cross sectional view of the interconnection section of the barrier metal of a semiconductor device according to a sixth embodiment of the invention.

FIG. 24 is a schematic cross sectional view of a semiconductor device according to a sixth embodiment of the invention. An interconnection groove 162 is formed in an interlayer dielectric film 161 of silicon oxide and a TaNyOz film 163 is formed on the side walls and the bottom surface of the interconnection groove 162. A TaNx film 164 is formed along the surface of the TaNyOz film 163. A Cu interconnection layer 165 is buried in the interconnection groove 162. Then, a silicon nitride film 166 is formed on the entire surface in order to prevent Cu diffusion from the surface of the Cu interconnection layer 165 into the overlying structure. The barrier metal film layer of this embodiment is a laminate film layer of a TaNyOz film layer 163 and a TaNx film layer 164.

Figure 25A:
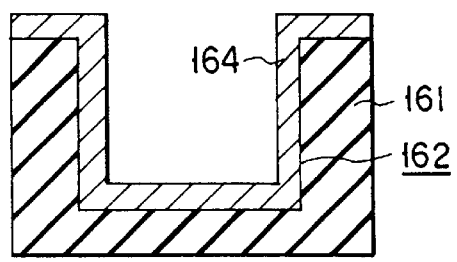
FIGS. 25A through 25D are schematic cross sectional views of the interconnection section of the embodiment of FIG. 24 in different manufacturing steps.
Figure 25B:
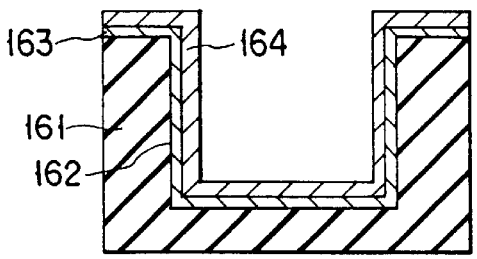
Figure 25C:
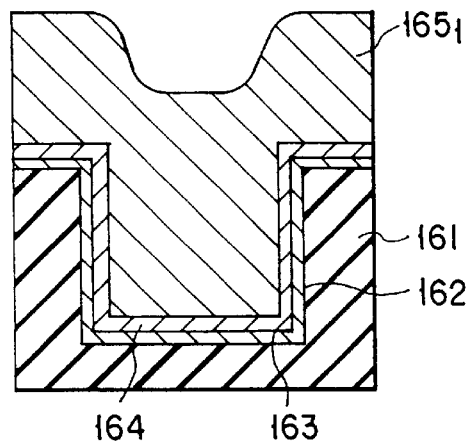
Figure 25D:
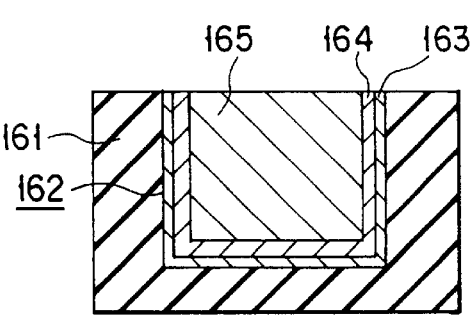

Now the method of manufacturing the above embodiment will be described by referring to FIGS. 25A through 25D. Firstly, as shown in FIG. 25A, an interconnection groove 162 is formed in the interlayer dielectric film 161 and a TaNx film 164 is formed on the entire surface of the device by sputtering. Subsequently, as shown in FIG. 25B, the interlayer dielectric film 161 is reduced along the interface of the interlayer dielectric film 161 and the TaNx film 164, while the TaNx film 164 is oxidized at the outer surface thereof to produce a TaNyOz film 163 there. Then, as shown in FIG. 25C, a Cu film $165_1$ is deposited on the entire surface of the device and the interconnection groove 162 is filled with the Cu film $165_1$. Thereafter, as shown in FIG. 25D, any excessive parts of the Cu film $165_1$, the TaNyOz film 163 and the TaNx film 164 are removed by means of a CMP technique to produce a Cu interconnection layer 165. Then, a silicon nitride film is deposited on the entire surface to produce a structure as shown in FIG. 24.

Figure 26:
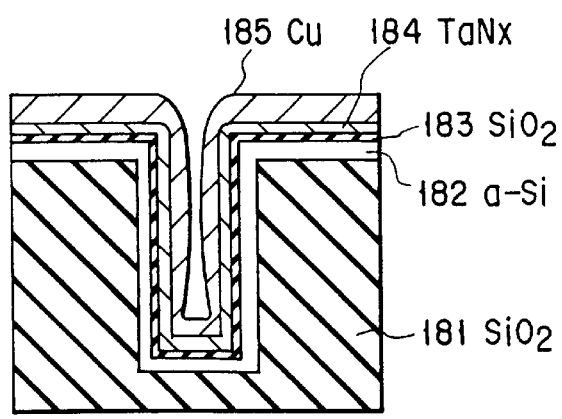
FIG. 26 is a cross sectional view of a semiconductor device according to the sixth embodiment of the invention, which is used to prove the barrier effect of the barrier metal used therein.

The barrier effect of the barrier metal of this embodiment was evaluated in a manner as described below. A sample comprising an amorphous silicon film 182, an $SiO_2$ film 183, a TaNx film 184 and a Cu film 185 formed sequentially in the above mentioned order as shown in FIG. 26 was prepared and annealed at 450° C. for 4 hours and the rate of generation of $Cu_3Si$ (Cu silicide) (silicidation rate) in the amorphous silicon film layer 182, into which Cu had been diffused by way of the barrier metal, was observed as index of the barrier effect of the barrier metal.

Now, the structure of the sample shown in FIG. 26 will be described. Grooves with a depth of 0.4 μm and a line/space ratio of 0.2/0.2 μm were formed by ordinary photolithography, or RIE, in a 700 nm thick $SiO_2$ film 181 deposited by plasma CVD. Note that only a single groove is shown in FIG. 24. Then, an amorphous silicon film 182 was formed on the entire surface by CVD. Subsequently, an $SiO_2$ film 183 was formed on the surface of the amorphous silicon film 182 as a result of exposing the latter to an oxidizing atmosphere. Furthermore, a TaNx film 184 was formed on the $SiO_2$ film 183 to a thickness of at least 5 nm. Then, a Cu film 185 was deposited on the TaNx film 184 without damaging the vacuum condition after the formation of the TaNx film 184.

The amorphous silicon film 182 had shown a film thickness of 30 nm before it was exposed to an oxidizing atmosphere and samples carrying an $SiO_2$ film 183 to respective film thicknesses of 2 nm, 4 nm and 6 nm were prepared by oxidizing the amorphous silicon film-182 with different durations of oxidation. A sample without oxidizing the amorphous silicon film 182 was also prepared. The samples of the specific $SiO_2$ film thicknesses were made to carry a $TaN_{0.1}$ film, a $TaN_{0.2}$ film, a $TaN_{0.5}$ film and a $TaN_{1.4}$ film respectively as TaNx film 184.

Figures 27, 28:
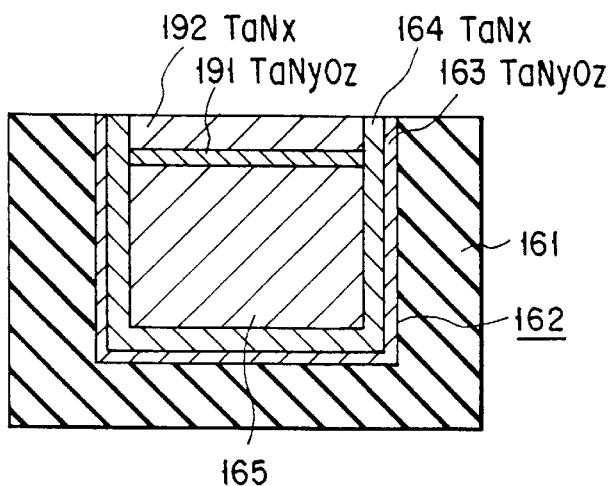
FIG. 27 is a chart showing the results of silicidation of the sixth embodiment obtained under various different conditions.
FIG. 28 is a schematic cross sectional view of the interconnection section of the barrier metal of a semiconductor device according to a seventh embodiment of the invention.

FIG. 27 summarily shows the results obtained by observing the silicidation rate of each of the samples. By arranging an oxygen-containing film layer ($SiO_2$ film 183) on the surface of the underlying layer on which a TaNx film layer 184 is formed, the TaNx film 184 and oxygen contained in the surface of the underlying layer react with each other to produce a TaNyOz film, which shows a remarkably improved barrier effect relative to the Cu film 185. Note that, when the generated TaNyOz film showed a film thickness of 4.5 nm, the TaNyOz film and the $SiO_2$ film were separated from each other during the process of heat treating the TaNyOz film to make the attempt for evaluating the barrier effect abortive.

As described above, a multilayer barrier metal film layer comprising a TaNx film layer and a TaNyOz film layer can be formed by forming the TaNx film layer on an oxygen containing interlayer dielectric film and subsequently reducing the interlayer dielectric film by means of the TaNx film to consequently oxidizing the TaNx film.

While an oxide film layer formed on the surface of an amorphous silicon layer is used as oxygen containing underlying layer in the above description, any oxide film layer adapted to reduce a TaNx film layer may be used for the purpose of the invention.

7th Embodiment

FIG. 28 is a schematic cross sectional view of a semiconductor device according to a seventh embodiment of the invention. Note that, in FIG. 28, the components that are same as their counterparts of FIGS. 25A through 25D are denoted respectively by the same reference symbols and will not be described any further.

This embodiment is characterised in that the surface of the Cu film 165 is made lower than the surface of the interlayer dielectric film 161 and a TaNyOz film 191 and a TaNx film 192 are sequentially formed on the Cu film 165. Note that the top of the TaNx film 192 is flush with the top of the interlayer dielectric film 161 and the laminate film of the TaNyOz film 191 and the TaNx film 192 is the barrier metal film of the embodiment for suppressing Cu diffusion from the surface of the Cu film 165.

Now, the method of manufacturing the device will be described by referring to FIGS. 29A through 29D. Note that the manufacturing steps illustrated in FIGS. 25A through 25D for the sixth embodiment are also used for this embodiment and will not be explained here any further.

Figure 29A:
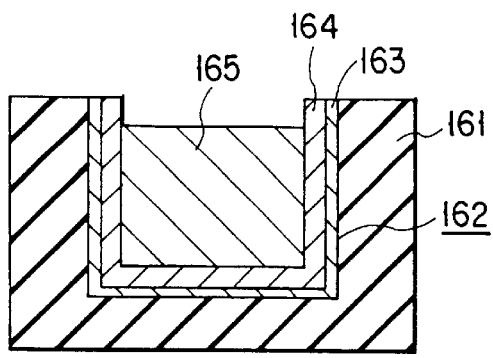
FIGS. 29A through 29D are schematic cross sectional views of the interconnection section of the embodiment of FIG. 28 in different manufacturing steps.

After the step of FIG. 25D, the Cu film 165 is selectively etched to make the surface of the Cu film 165 lower than the surface of the interlayer dielectric film 161 as shown in FIG. 29A.

Figure 29B:
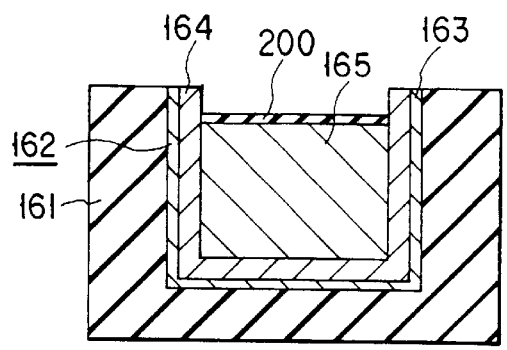
Figure 29C:
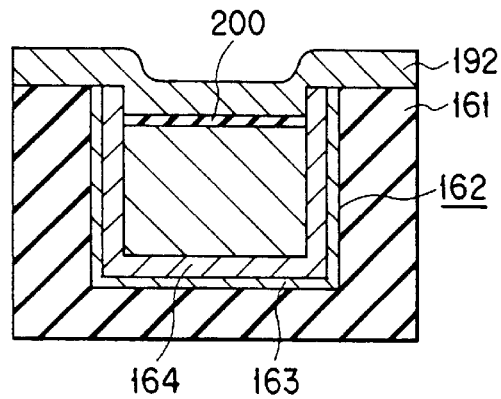

Then, as shown in FIG. 29B, the exposed surface of the Cu film 165 is oxidized to produce a copper oxide film 200. Thereafter, as shown in FIG. 29C, a TaNx film 192 is formed.

Figure 29D:
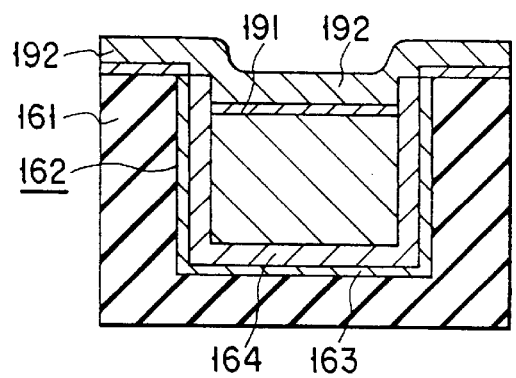

Subsequently, as shown in FIG. 29D, the copper oxide film 200 is reduced by annealing and a TaNyOz film 191 is formed by oxidizing the TaNx film 192 along the surface held in contact with the copper oxide film 200.

Then, the TaNyOz film 191 and the TaNx film 192 on the interlayer dielectric film 161 are removed by CMP to make the top of the interlayer dielectric film 161 flush with that of the TaNx film 192 and complete the operation of preparing the structure of FIG. 28.

Figure 30:
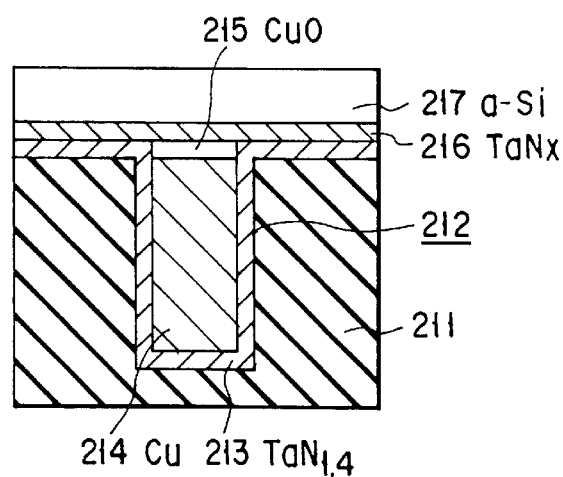
FIG. 30 is a cross sectional view of a semiconductor device according to the seventh embodiment of the invention, which is used to prove the barrier effect of the barrier metal used therein.

In an experiment, the barrier effect of the barrier metal of this embodiment was evaluated. More specifically, samples having a configuration as shown in FIG. 30 and comprising a Cu film 214, a copper oxide film 215, a TaNx film 216 and an amorphous silicon film 217 formed sequentially in the above mentioned order were prepared and annealed at 450° C. for 4 hours. As a result, the copper oxide film 215 was reduced by the TaNx film 216 to consequently oxidize the TaNx film 216 and produce a TaNyOz film and, at the same time, $Cu_3Si$ (copper silicide) was produced by Cu diffused into the amorphous silicon film by way of the barrier metal film. The rate of generation of copper silicide (silicidation rate) was observed as index of the barrier effect of the barrier metal.

Now, the structure of the sample shown in FIG. 30 will be described. A 700 nm thick $SiO_2$ film 211 was formed by deposition by means of a plasma CVD method. Grooves 212 with a depth of 0.4 μm and a line/space ratio of 0.2/0.2 μm were formed by ordinary photolithography, or RIE, in a 700 nm thick $SiO_2$ film 211 deposited by plasma CVD. Note that only a single groove is shown in FIG. 30. Then, a $TaN_{1.4}$ film 213 was formed on the entire surface to a thickness of at least 5 nm by sputtering. Subsequently, a Cu film was deposited on the $TaN_{1.4}$ film 213 to a thickness of 400 nm by CVD and polishing the Cu film by CMP to fill the groove with a Cu damascene interconnection layer 214. A copper oxide film 216 was formed on the surface of the buried Cu damascene interconnection layer 214 by heat treating the latter in a oxidizing atmosphere. Then, a TaNx film 215 was formed to a film thickness of 10 nm on the entire surface to a film thickness of 10 nm and an amorphous silicon film 217 was deposited by sputtering without damaging the vacuum condition after the formation of the TaNx film 216.

Samples carrying a copper oxide film 215 to respective film thicknesses of 1 nm, 3 nm, 5 nm and 10 nm were prepared by oxidizing the Cu damascene interconnection layer 214 with different durations of oxidation. A sample without oxidizing the Cu damascene interconnection film was also prepared. The samples of the specific copper oxide film thicknesses were made to carry a $TaN_{0.1}$ film, a $TaN_{0.2}$ film, a $TaN_{0.5}$ film and a $TaN_{1.4}$ film respectively as TaNx film 216.

FIG. 31 summarily shows the results obtained by observing the silicidation rate of each of the samples. The barrier effect of the TaNx film of the embodiment was confirmed as in the case of the fifth embodiment. Note that, when the copper oxide film 215 formed on the surface of the Cu damascene interconnection layer 214 showed a film thickness of 10 nm, the barrier metal was separated from the surface of the Cu oxide film to make the attempt for evaluating the barrier effect abortive.

While a copper oxide film 215 is formed on the surface of the Cu interconnection layer 214 by heat treating the latter in an oxygen atmosphere and used as oxygen source for forming a TaNyOz film in the above description of the embodiment, it was confirmed that oxygen contained in the Cu interconnection layer will be diffused, along the interface of the Cu interconnection layer and the TaNx film, to produce a TaNyOz film, by firstly depositing a TaNx film on the Cu interconnection layer into which oxygen had been introduced in advance and heat treating the TaNx film in vacuum. In the latter case, it was also confirmed that the resistivity of the Cu interconnection layer is reduced as oxygen contained in the Cu interconnection layer is consumed to form a TaNyOz film along the interface so that the film thickness of the TaNyOz film can be controlled by controlling the oxygen concentration in the Cu interconnection layer.

As described above, a laminate barrier metal film layer comprising a TaNx film and a TaNyOz film can be formed by firstly forming a TaNx film on a copper oxide film produced on the surface of a Cu interconnection layer or a Cu interconnection layer made to contain oxygen and subsequently reducing the copper oxide film or the oxygen containing Cu interconnection layer by means of the TaNx film to consequently oxidizing the TaNx film.

8th Embodiment

While a multilayer $\alpha\beta n$ film with different n values is realized for the first embodiment by modifying the flow rate of the source gas of element stepwise, an film with a continuously changing compositional ratio may be realized by gradually and continuously modifying the gas flow rate. The eighth embodiment represents a semiconductor device comprising such a barrier metal film layer.

Since the eighth embodiment of semiconductor device has a configuration same as that of the first embodiment shown in FIG. 2, only the detailed configuration of the barrier metal film layer 20 of the eighth embodiment will be discussed here. Samples of this embodiment were prepared by using respective barrier metal film layers $20_9$ through $20_{12}$ of tantalum nitride with different compositional ratios and tested for the barrier effect.

The barrier metal film $20_9$ of sample A shown in FIG. 32A comprises a 16 nm thick $TaN_{0.87}$ film layer 331 formed on the bottom surface and the side walls of the interconnection groove 16 and a 4 nm thick $TaN_{1.19}$ film layer 332 formed on the $TaN_{0.87}$ film layer 331 and connected to the Cu interconnection layer 17.

The barrier metal film $20_{10}$ of sample B shown in FIG. 32B comprises a 16 nm thick $TaN_{0.87}$ film layer 333 formed on the bottom surface and the side walls of the interconnection groove 16 and a 4 nm thick $TaN_{1.19}$-1.05 film layer 334 formed on the $TaN_{0.87}$ film layer 333 with a compositional ratio that continuously changes from $TaN_{1.19}$ to $TaN_{1.05}$ to the film thickness direction away from the layer 333 and connected to the Cu interconnection layer 17.

The barrier metal film $20_{11}$ of sample C shown in FIG. 32C comprises a 4 nm thick $TaN_{1.19}$ film layer 335 formed on the bottom surface and the side walls of the interconnection groove 16 and a 16 nm thick $TaN_{0.87}$ film layer 336 formed on the $TaN_{1.19}$ film layer 335 and connected to the Cu interconnection layer 17.

The barrier metal film $20_{12}$ of sample D shown in FIG. 32D comprises a 4 nm thick $TaN_{1.05}$-1.19 film layer 337 formed on the bottom surface and the side walls of the interconnection groove 16 with a compositional ratio that continuously changes from $TaN_{1.05}$ to $TaN_{1.19}$ to the film thickness direction away from the bottom surface or the side walls and a 16 nm thick $TaN_{0.87}$ film layer 338 formed on the $TaN_{1.05}$-1.19 film layer 337 and connected to the Cu interconnection layer 17.

The $TaN_{0.87}$ film layers 331, 333, 336, 338 and the $TaN_{1.19}$ film layers 332, 335 of the barrier metal film layers $20_9$ through $20_{12}$ are formed in a following manner. The $TaN_{0.87}$ film layers 331, 333, 336, 338 are formed by means of long-throw-sputtering, selecting 10 sccm and 15 sccm respectively for the flow rate of Ar gas and that of $N_2$ gas, using a Ta target and heating the substrate to about 300° C. The $TaN_{1.19}$ film layers 332 and 335 are formed by means of long-throw-sputtering, selecting 10 sccm and 20 sccm, respectively, for the flow rate of Ar gas and that of $N_2$ gas, using a Ta target and heating the substrate to about 300° C.

On the other hand, the $TaN_{1.19-1.05}$ film layer 334 and the $TaN_{1.05-1.19}$ film layer 337 of the barrier metal film layers $20_9$ through $20_{12}$ are formed in a following manner. The $TaN_{1.19-1.05}$ film layer 334 is formed by means of long-throw-sputtering, selecting 10 sccm for the flow rate of Ar gas and continuously changing the $N_2$ gas flow rate from 20 sccm to 16 sccm, while using a Ta target and heating the substrate to about 300° C. The $TaN_{1.05-1.19}$ film layer 337 is formed by means of long-throw-sputtering, selecting 10 sccm for the flow rate of Ar gas and continuously changing the $N_2$ gas flow rate from 16 sccm to 20 sccm, while using a Ta target and heating the substrate to about 300° C.

The two-layered structure of the barrier metal film layer of each of the samples A through D can be realized in an uninterrupted manner by modifying the $N_2$ gas flow rate without changing the Ar gas flow rate.

An RBS measurement method was used to identify the compositional ratio of the tantalum nitride of each of the samples, using a film deposited with the selected Ar and $N_2$ gas flow rates.

Then, the barrier metal film layer of each of the samples was tested for the interconnect resistance of the Cu interconnection layer. The electric resistance of the via was observed by means of the Kelvin method. The barrier effect was evaluated by preparing a structure as shown in FIG. 5 and determining the silicidation rate. FIG. 33 is a chart summarily illustrating the results obtained for the interconnect resistance, the via resistance and the silicidation rate of each of the samples.

As seen from FIG. 33, the sample A shows a low via resistance, maintaining a high barrier effect, but its interconnect resistance is high. The barrier metal film $20_9$ of sample A is a multilayer structure comprising a $TaN_{0.87}$ film layer 331 formed on the bottom surface and the side walls of the interconnection groove 16 and connected to the W via-plug 14 and a 4 nm thick $TaN_{1.19}$ film layer 332 formed on the $TaN_{0.87}$ film layer 331 and connected to the Cu interconnection layer.

On the other hand, the sample B shows a relatively low interconnect resistance, while maintaining a high barrier effect and suppressing the via resistance to a low level. The barrier metal film $20_{10}$ of sample B is a multilayer structure comprising a 16 nm thick $TaN_{0.87}$ film layer 333 formed on the bottom surface and the side walls of the interconnection groove 16 and connected to the W via-plug 14 and a 4 nm thick $TaN_{1.19-1.05}$ film layer 334 formed on the $TaN_{0.87}$ film layer 333 and connected to the Cu interconnection layer. The inventors believe that the excellent performance of the sample B is attributable to the improvement in the phenomenon of void left in the Cu interconnection layer due to an insufficient Cu reflow given rise to by a reduced ratio of the number of N atoms relative to that of Ta atoms.

The sample C shows a low interconnect resistance, maintaining a high barrier effect, but its via resistance is high. The barrier metal film $20_{11}$ of sample C is a multilayer structure comprising a $TaN_{1.19}$ film layer 335 formed on the bottom surface and the side walls of the interconnection groove 16 and connected to the W via-plug 14 and a $TaN_{0.87}$ film layer 336 formed on the $TaN_{1.19}$ film layer 335 and connected to the Cu interconnection layer.

On the other hand, the sample D shows a relatively low via resistance, while maintaining a high barrier effect and suppressing the interconnect resistance to a low level. The barrier metal film $20_{11}$ of sample D is a multilayer structure comprising a $TaN_{105-1.19}$ film layer 337 formed on the bottom surface and the side walls of the interconnection groove 16 with a compositional ratio that continuously changes from $TaN_{1.05}$ to $TaN_{-1.19}$ to the film thickness direction away from the bottom surface or the side walls and connected to the W via-plug 14 and a $TaN_{0.87}$ film layer 338 formed on the $TaN_{105-1.19}$ film layer 337 and connected to the Cu interconnection layer. The inventors believe that the excellent performance of the sample D is attributable to the improvement in the phenomenon of an undesired increase of the electric resistance of the surface of W via-plug 14 due to the nitriding of the surface given rise to by a reduced flow rate of the $N_2$ gas flow in the initial stages of the process of depositing the $TaN_{1.05-1.19}$ film layer 337.

As described above, a barrier metal film layer showing a reduced interconnect resistance, a low via resistance and a high barrier effect can be obtained by producing a multilayer structure of a $TaN_{0.87}$ film layer and a $TaN_{1.19-1.05}$ film layer. Similarly, a barrier metal film layer showing a reduced via resistance, a low interconnect resistance and a high barrier effect can be obtained by producing a multilayer structure of a $TaN_{1.05-1.19}$ film layer and a $TaN_{0.87}$ film layer.

It should be noted that the present invention is by no means limited to the above described embodiments. For example, a laminate barrier metal layer is formed by laying compound films containing a same metal element and same additive elements is formed for each of the above embodiments, but the component layers of the barrier metal layer may contain different respective metal elements. However, a laminate film can be formed in a simple process by simply modifying the rate of supplying the light elements (boron, oxygen, carbon, nitrogen) if a same metal element is used for the component layers of the laminate. Additionally, the interlayer reaction can be suppressed if a same metal element is used for the component layers of the laminate.

Any of the elements of the IVB group, the VB group or the VIB group may be used for the metal element of a barrier metal layer for the purpose of the invention. A barrier metal film layer according to the invention can be also used for metal interconnects and metal electrodes other than plug electrodes.

While a TaNx film and a TaNyOz film are used as compound films to be used for a barrier metal layer in the above fifth and sixth embodiments, the two embodiments are by no means limited thereto and a compound film $\alpha\gamma n$ formed by at least one metal element $\alpha$ other than tantalum and at least one element $\gamma$ selected from boron, carbon and nitrogen, and its oxide film $\alpha\gamma y O z$ may also be used for the purpose of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

a compound film $\alpha\gamma_x$ made of at least one element $\alpha$ selected from metal elements and at least one element $\gamma$ selected from the group consisting of boron, carbon, and nitrogen on a base layer containing oxygen (O); and forming a compound film $\alpha\gamma_y O_z$ by causing said compound film $\alpha\gamma_x$ to reduce said base layer and thereby oxidizing said compound film $\alpha\gamma_x$ on an interface of said first compound film $\alpha\gamma_x$ and said base layer, wherein each of x and y is a ratio of the number of atoms of said element $\gamma$ relative to the number of atoms of said element $\alpha$, $\gamma$ being greater than zero, and z is a ratio of the number of atoms of said oxygen relative to the number of atoms of said element $\alpha$.

2. A method of manufacturing a semiconductor device according to claim 1, wherein said base layer is a dielectric film layer.

3. A method of manufacturing a semiconductor device according to claim 1, wherein said base layer is a metal interconnection layer.

4. A method of manufacturing a semiconductor device comprising:

forming a groove on a surface of a base layer containing oxygen (O);

forming a first compound film $\alpha\gamma_x$ made of at least one element $\alpha$ selected from metal elements and at least one element $\gamma$ selected from the group consisting of boron, carbon, and nitrogen along an inner surface of said groove, wherein x is a ratio of the number of atoms of said element $\gamma$ relative to the number of atoms of said element $\alpha$;

forming a second compound film $\alpha\gamma_y O_z$ by causing said first compound film $\alpha\gamma_x$ to reduce said base layer and thereby oxidizing said first compound film $\alpha\gamma_x$ on an interface of said first compound film $\alpha\gamma_x$ and said base layer, wherein y is a ratio of the number of atoms of said element γ relative to the number of atoms of said element α, and z is a ratio of the number of atoms of said oxygen relative to the number of atoms of said element α;

filling a metal layer in said groove via said first compound film $\alpha\gamma_x$ and said second compound film $\alpha\gamma_y O_z$, such that a top surface of said metal layer is made lower than said surface of said base layer;

oxidizing said top surface of said metal layer to form an oxide layer;

forming a third compound film $\delta\theta_u$ made of at least one element δ selected from metal elements and at least one element θ being nitrogen on said oxide layer, wherein u is a ratio of the number of atoms of said element θ relative to the number of atoms of said element δ; and forming a fourth compound film $\delta\theta_v O_w$ by causing said third compound film $\delta\theta_u$ to reduce said oxide layer and thereby oxidizing said third compound film $\delta\theta_u$ on an interface of said third compound film $\delta\theta_u$ and said oxide layer, wherein v is a ratio of the number of atoms of said element θ relative to the number of atoms of said element δ, and w is a ratio of the number of atoms of said oxygen relative to the number of atoms of said element δ.

5. A method of manufacturing a semiconductor device according to claim 4, further comprising flattening said third compound film $\delta\theta_u$ to be flush with said surface of said base layer, after forming said fourth compound film $\delta\theta_v O_w$.

6. A method of manufacturing a semiconductor device comprising:

forming a groove on a surface of a base layer containing oxygen (O);

filling a metal layer in said groove such that a top surface of said metal layer is made lower than said surface of said base layer;

oxidizing said top surface of said metal layer to form an oxide layer;

forming a first compound film $\delta\theta_u$ made of at least one element δ selected from metal element and at least one element θ being nitrogen on said oxide layer, wherein u is a ratio of the number of atoms of said element θ relative to the number of atoms of said element δ; and forming a second compound film $\delta\theta_v O_w$ by causing said first compound film $\delta\theta_u$ to reduce said oxide layer and thereby oxidizing said first compound film $\delta\theta_u$ on an interface of said first compound film $\delta\theta_u$ and said oxide layer, wherein v is a ratio of the number of atoms of said element θ relative to the number of atoms of said element δ, and w is a ratio of the number of atoms of said oxygen relative to the number of atoms of said element δ.

7. A method of manufacturing a semiconductor device according to claim 6, further comprising flattening said first compound film $\delta\theta_u$ to be flush with said surface of said base layer, after forming said second compound film $\delta\theta_v O_w$.

* * * * *

UNITED STATES PATENT AND TRADEMARK OFFICE
CERTIFICATE OF CORRECTION

PATENT NO. : 6,518,177 B1  
DATED : February 11, 2003  
INVENTOR(S) : Kawanoue et al.

It is certified that error appears in the above-identified patent and that said Letters Patent is hereby corrected as shown below:

<u>Title page,</u>  
Item [62], Related U.S. Application Data, change "Pat. No. 6229,911." to -- Pat. No. 6,229,211. --

<u>Column 26,</u>  
Line 36, before "a compound film $\alpha\gamma_x$" insert -- forming --.  
Line 48, change "$\gamma$ being" to -- y being --.

Signed and Sealed this

Nineteenth Day of August, 2003

JAMES E. ROGAN  
*Director of the United States Patent and Trademark Office*